(12) United States Patent
Prahlad et al.

(10) Patent No.: US 9,130,484 B2
(45) Date of Patent: Sep. 8, 2015

(54) VACUUM AUGMENTED ELECTROADHESIVE DEVICE

(71) Applicant: SRI International, Menlo Park, CA (US)

(72) Inventors: Harsha Prahlad, Cupertino, CA (US); Thomas P. Low, Belmont, CA (US); Ronald E. Pelrine, Longmont, CO (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 14/052,463

(22) Filed: Oct. 11, 2013

(65) Prior Publication Data

US 2014/0036404 A1 Feb. 6, 2014

Related U.S. Application Data

(63) Continuation-in-part of application No. 13/653,376, filed on Oct. 16, 2012, now Pat. No. 8,982,531.

(60) Provisional application No. 61/713,174, filed on Oct. 12, 2012, provisional application No. 61/549,099, filed on Oct. 19, 2011.

(51) Int. Cl.
*H01T 23/00* (2006.01)
*H02N 13/00* (2006.01)
*H01L 21/683* (2006.01)

(52) U.S. Cl.
CPC ............ *H02N 13/00* (2013.01); *H01L 21/6831* (2013.01); *H01L 21/6833* (2013.01)

(58) Field of Classification Search
USPC .................................................. 361/230, 234
See application file for complete search history.

(56) References Cited

U.S. PATENT DOCUMENTS

| | | | |
|---|---|---|---|
| 4,969,168 A | 11/1990 | Sakamoto et al. | |
| 5,695,566 A * | 12/1997 | Suzuki et al. | ............. 118/723 E |
| 6,229,871 B1 * | 5/2001 | Tichenor | .......................... 378/34 |
| 6,865,065 B1 * | 3/2005 | Chen et al. | .................... 361/234 |
| 2003/0044577 A1 | 3/2003 | Dhar et al. | |

(Continued)

FOREIGN PATENT DOCUMENTS

WO 2007/110191 A1 10/2007

OTHER PUBLICATIONS

PCT International Search Report and Written Opinion, PCT International Application No. PCT/US2013/064624, dated Mar. 6, 2014.

*Primary Examiner* — Danny Nguyen
(74) *Attorney, Agent, or Firm* — McDonnell Boehnen Hulbert & Berghoff LLP

(57) ABSTRACT

An electroadhesive gripping system includes a vacuum-augmented gripper. The gripper can include an electroadhesive surface associated with one or more electrodes and a load-bearing backing structure coupled to the electroadhesive surface. The backing couples to the backside of the electroadhesive surface so as to at least partially define a shape of the electroadhesive surface. The backing is configured to flex between a curled shape and an uncurled shape. A spreading arm is configured to apply force to the backing so as to flex the backing from the curled shape to the uncurled shape. When positioned next to a substrate, the uncurling motion of the backing can cause the electroadhesive surface to become vacuum sealed to the substrate. A power supply can be configured to apply voltage to the electroadhesive surface.

20 Claims, 18 Drawing Sheets

(56) References Cited

U.S. PATENT DOCUMENTS

| | | |
|---|---|---|
| 2005/0030469 A1 | 2/2005 | Murata et al. |
| 2008/0089002 A1 | 4/2008 | Pelrine et al. |
| 2010/0194012 A1 | 8/2010 | Tatsumi et al. |
| 2011/0111601 A1* | 5/2011 | Okita et al. ............... 438/716 |
| 2012/0044618 A1* | 2/2012 | Lee ............... 361/679.01 |

* cited by examiner

VACUUM AUGMENTED ELECTROADHESIVE DEVICE

CROSS-REFERENCE TO RELATED APPLICATIONS

This application is a continuation-in-part of U.S. patent application Ser. No. 13/653,376, filed Oct. 16, 2012, which claims priority to U.S. Provisional Patent Application No. 61/549,099, filed Oct. 19, 2011; this application also claims priority to U.S. Provisional Patent Application No. 61/713,174, filed Oct. 12, 2012, all of which are incorporated herein by reference in their entireties and for all purposes.

BACKGROUND

Unless otherwise indicated herein, the materials described in this section are not prior art to the claims in this application and are not admitted to be prior art by inclusion in this section.

The mass production of products has led to many innovations over the years. Substantial developments have been made in the industrial handling of various materials and items, particularly in the area of robotics. For example, various types of robotics and other automated systems are now used in order to "pick and place" items during many manufacturing and other materials handling processes. Such robotics and other systems can include robot arms that, for example, grip, lift and/or place an item as part of a designated process. Of course, other manipulations and materials handling techniques can also be accomplished by way of such robotics or other automated systems. Despite many advances over the years in this field, there are limitations as to what can be handled in such a manner.

Conventional robotic grippers typically use either suction or a combination of large normal forces and fine control with mechanical actuation in order to grip objects. Such techniques have several drawbacks. For example, the use of suction tends to require smooth, clean, dry and generally flat surfaces, which limits the types and conditions of objects that can be gripped. Suction also tends to require a lot of power for the pumps and is prone to leaks at any location on a vacuum or low pressure seal, with a resulting loss of suction being potentially catastrophic. The use of mechanical actuation often requires large normal or "crushing" forces against an object, and also tends to limit the ability to robotically grip fragile or delicate objects. Producing large forces also increases the cost of mechanical actuation. Mechanical pumps and conventional mechanical actuation with large crushing forces also often require substantial weight, which is a major disadvantage for some applications, such as the end of a robot arm where added mass must be supported. Furthermore, even when used with sturdy objects, robotic arms, mechanical claws and the like can still leave damaging marks on the surface of the object itself.

Alternative techniques for handling items and materials via non-permanent and/or reversible attachment may be employed. Chemical adhesives can leave residues and tend to attract dust and other debris that reduce effectiveness. Chemical adhesives can also require a significant amount of added force to undo or overcome a grip or attachment to an object once such a chemical adhesive grip or attachment is applied, since the gripping interaction and force is typically not reversible in such instances. Another approach to providing an attachment to an item involves the use of fasteners such as nails, screws, adhesive binding, rope, twine, and so on. However, similar to chemical adhesives, such fasteners are typically not readily detachable and therefore the attachment may not be reversible without an additional undertaking, and may lead to damage to the item or substrate.

Other approaches to non-permanent and/or reversible attachment of an object to a substrate may rely on van der Waals forces. These forces, which are exploited by natural geckos and more recent "artificial gecko" systems often require the use of a mechanical smoothing (pressure) force when applied to a substrate in order to induce the intimate contact, and as such these systems are typically not well suited to sustain large loads over long periods of time.

SUMMARY

Some examples relate to electroadhesive surfaces and devices. Such an electroadhesive surface can include electrodes that are configured to induce an electrostatic attraction with nearby objects when an appropriate voltage or current is applied to the electrodes. In some cases the electrode polarization can induce a corresponding polarization in a nearby object to effect adhesion of the object to the electroadhesive surface. Systems disclosed herein include frame backings for electroadhesive surfaces that are configured to change shape from a curled shape to an uncurled shape. When the electroadhesive surface is pressed against a target item, the transition from the curled shape to the uncurled shape can cause the electroadhesive surface to be smoothed across the target surface in a manner that forces air and contaminants to evacuate the interface between the gripping surface and the target substrate. The uncurling, smoothing application of the frame can thereby create a vacuum seal between the gripping surface and the target substrate.

Some embodiments of the present disclosure provide a system. The system can include an electroadhesive surface, a load-bearing backing, and a power supply. The electroadhesive surface can be associated with one or more electrodes. The load-bearing backing can be coupled to a backside of the electroadhesive surface so as to at least partially define a shape thereof. The backing can be configured to flex from a curled shape to an uncurled shape. The flexion can induce a corresponding transition in the shape of the electroadhesive surface. The power supply can be configured to apply a voltage to the one or more electrodes associated with the electroadhesive surface to thereby cause the electroadhesive surface to adhere to an item situated proximate to the electroadhesive surface.

Some embodiments of the present disclosure provide a method. The method can include placing an electroadhesive surface in contact with an item. The electroadhesive surface can be coupled to a load-bearing backing. The backing can be coupled to a backside of the electroadhesive surface so as to at least partially define a shape thereof. The method can include applying force to the backing so as to cause the backing to flex from a curled shape to an uncurled shape. The flexion can induce a corresponding transition in the shape of the electroadhesive surface. The method can include applying voltage to one or more electrodes associated with the electroadhesive surface to thereby cause the electroadhesive surface to adhere to the item. The method can include reducing the voltage applied to the one or more electrodes such that the item is released from the electroadhesive surface.

These as well as other aspects, advantages, and alternatives, will become apparent to those of ordinary skill in the art by reading the following detailed description, with reference where appropriate to the accompanying drawings.

DETAILED DESCRIPTION

Figure 1A:
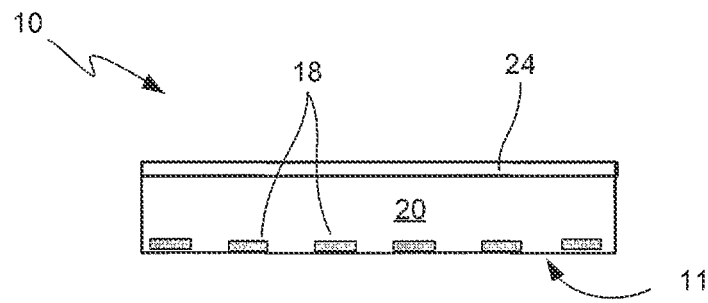
FIG. 1A is a side cross-section of an example electroadhesive device.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. Overview

Gripping systems disclosed herein allow for selectively adhering to an object via a combination of vacuum forces and induced electrostatic attraction. Systems and devices disclosed herein include a flexible electroadhesive gripping surface that is applied to an object so as to induce a vacuum seal between the gripping surface and the object. The vacuum attraction can then supplement and/or replace electroadhesion to secure the object to the gripping surface. Such systems find application in automated and/or manual handling of smooth surfaces suitable for forming vacuum seal, such as sheets of glass or other smooth substrates.

To create a vacuum seal between an electroadhesive surface and a target substrate, a frame is disclosed that includes a backing for the electroadhesive gripping surface. The backing is configured to flex between a curled shape and an uncurled shape. When pressed against a target substrate, the gripping surface initially makes contact with a small portion of the target substrate, and then is smoothed outward across the target substrate as the backing is uncurled against the target substrate. The resulting smoothing action evacuates air and contaminants between the interface of the target substrate and the gripping surface and results in a vacuum seal between the two. Activating electroadhesion in the gripping surface enhances and complements the vacuum adhesion to make the combined adhesive force stronger and more resilient than either adhesive technology alone.

To release the seal, the electrostatic attraction is deactivated, and the frame is allowed to return to its curled shape, which peels the gripping surface away from the target substrate starting with the edges and moving inward. The re-curling of the gripping surface thereby automatically breaks the vacuum seal to allow the item to be released.

In comparison with conventional vacuum seal systems, the present disclosure allows for sealing to dirty surfaces (e.g., dust covered glass). The electroadhesion causes the flexible gripping surface to remain tightly sealed around particulates on the object or substrate. Electroadhesion also affords a relatively more resilient vacuum seal, because small gaps or air pockets formed due to transient stresses or peeling are self-corrected to reform the seal by the electroadhesion pulling the gripping surface back to the object. By contrast, conventional vacuum seals do not self-repair upon formation of air pockets between the sealing surface and the object. Thus, the vacuum-augmented electroadhesive systems and devices disclosed herein create adhesion with relatively greater strength and reliability in comparison to systems employing vacuum adhesion alone or electrostatic adhesion alone. The disclosed systems and devices therefore enables automated and/or manual item-handling operations to include higher speed maneuvers, to move heavier loads, and to be undertaken with relatively greater predictability and/or safety than conventional systems, among other advantages.

II. Example Electroadhesive Systems

As the term is used herein, 'electroadhesion' refers to the mechanical coupling of two objects using electrostatic forces. Electroadhesion as described herein uses electrical control of these electrostatic forces to permit temporary and detachable attachment between two objects. This electrostatic adhesion holds two surfaces of these objects together or increases the effective traction or friction between two surfaces due to electrostatic forces created by an applied electric field. In addition to holding two flat, smooth and generally conductive surfaces together, disclosed herein are electroadhesion devices and techniques that do not limit the material properties or surface roughness of the objects subject to electroadhesive forces and handling. In some cases, an electroadhesive surface may be a compliant surface to facilitate electroadhesive attraction independent of surface roughness. For example, the electroadhesive surface may have sufficient flexibility for the surface to follow local non-uniformities and/or imperfections of an exterior surface of an adhered object. For example, the electroadhesive surface can at least partially conform to microscopic, mesoscopic, and/or macroscopic surface features. When an appropriate voltage is applied to such a compliant electroadhesive surface, the electroadhesive surface is attracted to the exterior surface of the adhered object, and the attraction causes the electroadhesive surface to at least partially conform to the exterior surface by flexing locally such that the electroadhesive surface moves toward the exterior surface.

The present disclosure relates in various embodiments to systems, devices and methods involving electroadhesive or electrostatic applications. In some embodiments, various electroadhesive or electrostatic systems or devices can include electrodes adapted to deliver an electrostatic force suitable to adhere separate objects together, as well as a base surface or other secondary adhesion component that facilitates the use of a secondary force or manner in addition to the electrostatic force in order to adhere the separate objects together. In some instances, such a base surface or other secondary adhesion component can include a soft pad material having multiple modes of adhesion to a foreign object. While the various examples disclosed herein focus on particular aspects of specific electroadhesive applications, it will be understood that the various principles and embodiments disclosed herein can be applied to other electrostatic applications and arrangements as well. In addition, while the various examples and discussions set forth herein often refer to a "secondary" force or component in addition to an electroadhesive force or components, it will be readily appreciated that such other forces or components need not be considered "secondary" in all instances. In some examples, it may be more appropriate to consider one type of forces or items as electrostatic or electroadhesive attraction forces or components, and another type of forces or items as separate attraction forces or components that are separate from the electrostatic or electroadhesive types. Such other attraction forces may be physical in nature, and as such can be referred to as physical attraction forces that can be used to augment the electrostatic or electroadhesion forces.

Turning first to FIG. 1A, an example electroadhesive device is illustrated in elevated cross-sectional view. Electroadhesive device 10 includes one or more electrodes 18 located at or near an "electroadhesive gripping surface" 11 thereof, as well as an insulating material 20 between electrodes and a backing 24 or other supporting structural component. For purposes of illustration, electroadhesive device 10 is shown as having six electrodes in three pairs, although it will be readily appreciated that more or fewer electrodes can be used in a given electroadhesive end effector. Where only a single electrode is used in a given electroadhesive device, a complimentary electroadhesive device having at least one electrode of the opposite polarity is preferably used therewith. With respect to size, electroadhesive device 10 is substantially scale invariant. That is, electroadhesive end effector sizes may range from less than 1 square centimeter to greater than several meters in surface area. Even larger and smaller surface areas are also possible, and may be sized to the needs of a given application.

Figure 1B:
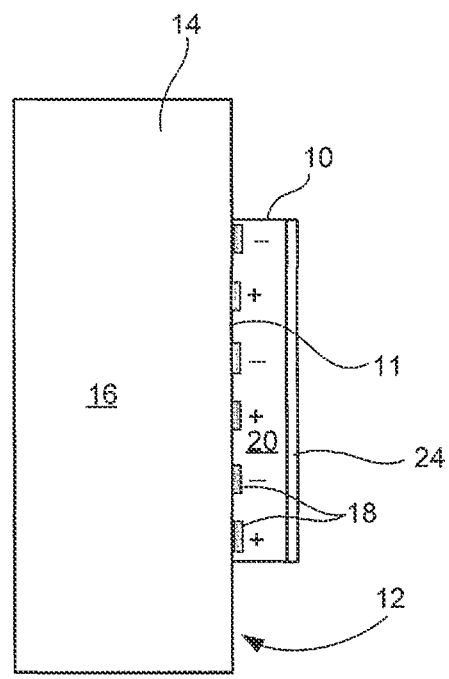
FIG. 1B illustrates in side cross-sectional view the example electroadhesive device of FIG. 1A adhered to a foreign object.

FIG. 1B depicts in elevated cross-sectional view of the example electroadhesive device 10 of FIG. 1A adhered to a foreign object 14. Foreign object 14 includes surface 12 and inner material 16. Electroadhesive gripping surface 11 of electroadhesive device 10 is placed against or nearby surface 12 of foreign object 14. An electrostatic adhesion voltage is then applied via electrodes 18 using external control electronics (not shown) in electrical communication with the electrodes 18. As shown in FIG. 1B, the electrostatic adhesion voltage uses alternating positive and negative charges on neighboring electrodes 18. As a result of the voltage difference between electrodes 18, one or more electroadhesive forces are generated, which electroadhesive forces act to hold the electroadhesive device 10 and foreign object 14 against each other. Due to the nature of the forces being applied, it will be readily appreciated that actual contact between electroadhesive device 10 and foreign object 14 is not necessary. Rather sufficient proximity to allow the electric field based electroadhesive interaction to take place is all that is necessary. For example, a piece of paper, thin film, or other material or substrate may be placed between electroadhesive device 10 and foreign object 14. Furthermore, although the term "contact" is used herein to denote the interaction between an electroadhesive device and a foreign object, it will be understood that actual direct surface to surface contact is not always required, such that one or more thin objects such as an insulator, can be disposed between an device or electroadhesive gripping surface and the foreign object. In some embodiments such an insulator between the gripping surface and foreign object can be a part of the device, while in others it can be a separate item or device.

Additionally or alternatively, there may be a gap between the electroadhesive gripping surface and the object being gripped and this gap can be decreased upon activation of the electroadhesive force. For example, the electroadhesive force can cause the electroadhesive gripping surface to move closer to the exterior surface of the object being gripped so as to close the gap. Moreover, the electroadhesive attraction can cause the gripping surface to move toward the exterior surface of the object being gripped at multiple points across the surface area of the gripping surface. For example, the compliant gripping surface to conform to the exterior surface microscopically, mesoscopically, and/or macroscopically. Such local gap-closing by the gripping surface can thereby cause the gripping surface to (at least partially) conform to the exterior surface of the object. Electroadhesive gripping surfaces with sufficient flexibility to conform to local non-uniformities, surface imperfections and other micro-variations and/or macro-variations in exterior surfaces of objects being adhered to are referred to herein as compliant gripping surfaces. However, it is understood that any of the gripping surfaces described herein may exhibit such compliance whether specifically referred to as compliant gripping surfaces or not.

Figure 1C:
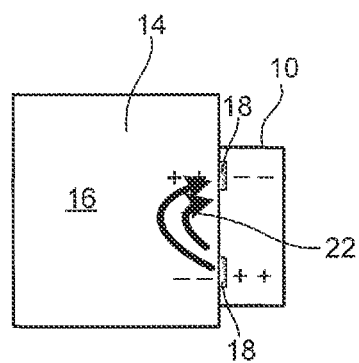
FIG. 1C illustrates in side cross-sectional close-up view an electric field formed in the foreign object of FIG. 1B as result of the voltage difference between electrodes in the adhered example electroadhesive device.

FIG. 1C illustrates in elevated cross-sectional close-up view an electric field formed in the foreign object of FIG. 1B as a result of the voltage difference between electrodes in the adhered example electroadhesive device 10. While the electroadhesive device 10 is placed against foreign object 14 and an electrostatic adhesion voltage is applied, an electric field 22 forms in the inner material 16 of the foreign object 14. The electric field 22 locally polarizes inner material 16 or induces direct charges on material 16 locally opposite to the charge on the electrodes of the device 18 and thus causes electrostatic adhesion between the electrodes 18 (and end effector 10) and the induced charges on the foreign object 16. The induced charges may be the result of a dielectric polarization or from weakly conductive materials and electrostatic induction of charge. In the event that the inner material 16 is a strong conductor, such as copper for example, the induced charges may completely cancel the electric field 22. In this case the internal electric field 22 is zero, but the induced charges nonetheless still form and provide electrostatic force to the electroadhesive device.

Thus, the electrostatic adhesion voltage provides an overall electrostatic force, between the electroadhesive device 10 and inner material 16 beneath surface 12 of foreign object 14, which electrostatic force maintains the current position of the electroadhesive end effector relative to the surface of the foreign object. The overall electrostatic force may be sufficient to overcome the gravitational pull on the foreign object 14, such that the electroadhesive device 10 may be used to hold the foreign object aloft. In various embodiments, a plurality of electroadhesive devices may be placed against foreign object 14, such that additional electrostatic forces against the object can be provided. The combination of electrostatic forces may be sufficient to lift, move, pick and place, or otherwise handle the foreign object. Electroadhesive device 10 may also be attached to other structures and hold these additional structures aloft, or it may be used on sloped or slippery surfaces to increase normal friction forces.

Removal of the electrostatic adhesion voltages from electrodes 18 ceases the electrostatic adhesion force between electroadhesive device 10 and the surface 12 of foreign object 14. Thus, when there is no electrostatic adhesion voltage between electrodes 18, electroadhesive device 10 can move more readily relative to surface 12. This condition allows the electroadhesive device 10 to move before and after an electrostatic adhesion voltage is applied. Well controlled electrical activation and de-activation enables fast adhesion and detachment, such as response times less than about 50 milliseconds, for example, while consuming relatively small amounts of power.

Electroadhesive device 10 includes electrodes 18 on an outside surface 11 of an insulating material 20. This embodiment is well suited for controlled attachment to insulating and weakly conductive inner materials 14 of various foreign objects 16. Other electroadhesive device 10 relationships between electrodes 18 and insulating materials 20 are also contemplated and suitable for use with a broader range of materials, including conductive materials. For example, a thin electrically insulating material (not shown) can be located on the surfaces of the electrodes. As will be readily appreciated, a shorter distance between surfaces 11 and 12 as well as the material properties of such an electrically insulating material results in a stronger electroadhesive attraction between the objects due to the distance dependence of the field-based induced electroadhesive forces. Accordingly, a deformable surface 11 adapted to at least partially conform to the surface 12 of the foreign object 14 can be used.

As the term is used herein, an electrostatic adhesion voltage refers to a voltage that produces a suitable electrostatic force to couple electroadhesive device 10 to a foreign object 14. The minimum voltage needed for electroadhesive device 10 will vary with a number of factors, such as: the size of electroadhesive device 10, the material conductivity and spacing of electrodes 18, the insulating material 20, the foreign object material 16, the presence of any disturbances to electroadhesion such as dust, other particulates or moisture, the weight of any objects being supported by the electroadhesive force, compliance of the electroadhesive device, the dielectric and resistivity properties of the foreign object, and/or the relevant gaps between electrodes and foreign object surface. In one embodiment, the electrostatic adhesion voltage includes a differential voltage between the electrodes 18 that is between about 500 volts and about 15 kilovolts. Even lower voltages may be used in micro applications. In one embodiment, the differential voltage is between about 2 kilovolts and about 5 kilovolts. Voltage for one electrode can be zero. Alternating positive and negative charges may also be applied to adjacent electrodes 18. The voltage on a single electrode may be varied in time, and in particular may be alternated between positive and negative charge so as to not develop substantial long-term charging of the foreign object. The resultant clamping forces will vary with the specifics of a particular electroadhesive device 10, the material it adheres to, any particulate disturbances, surface roughness, and so forth. In general, electroadhesion as described herein provides a wide range of clamping pressures, generally defined as the attractive force applied by the electroadhesive end effector divided by the area thereof in contact with the foreign object.

The actual electroadhesion forces and pressure will vary with design and a number of factors. In one embodiment, electroadhesive device 10 provides electroadhesive attraction pressures between about 0.7 kPa (about 0.1 psi) and about 70 kPa (about 10 psi), although other amounts and ranges are certainly possible. The amount of force needed for a particular application may be readily achieved by varying the area of the contacting surfaces, varying the applied voltage, and/or varying the distance between the electrodes and foreign object surface, although other relevant factors may also be manipulated as desired.

Because an electrostatic adhesion force is the primary force used to hold, move or otherwise manipulate a foreign object, rather than a traditional mechanical or "crushing" force, the electroadhesive device 10 can be used in a broader set of applications. For example, electroadhesive device 10 is well suited for use with rough surfaces, or surfaces with macroscopic curvature or complex shape. In one embodiment, surface 12 includes roughness greater than about 100 microns. In a specific embodiment, surface 12 includes roughness greater than about 3 millimeters. In addition, electroadhesive device 10 can be used on objects that are dusty or dirty, as well as objects that are fragile. Objects of varying sizes and shapes can also be handled by one or more electroadhesive devices, as set forth in greater detail below.

2b) Electroadhesive Gripping Surfaces

Although electroadhesive device 10 having electroadhesive gripping surface 11 of FIG. 1A is shown as having six electrodes 18, it will be understood that a given electroadhesive device or gripping surface can have just a single electrode. Furthermore, it will be readily appreciated that a given electroadhesive device can have a plurality of different electroadhesive gripping surfaces, with each separate electroadhesive gripping surface having at least one electrode and being adapted to be placed against or in close proximity to the foreign object to be gripped. Although the terms electroadhesive end effector, electroadhesive gripping unit and electroadhesive gripping surface are all used herein to designate electroadhesive components of interest, it will be understood that these various terms can be used interchangeably in various contexts. In particular, while a given electroadhesive device might comprise numerous distinct gripping surfaces, these different gripping surfaces might also be considered separate "devices" or alternatively "end effectors" themselves. Embodiments with multiple different gripping surfaces may be considered as one single device or may also be considered as numerous different devices acting in concert.

Figure 2A:
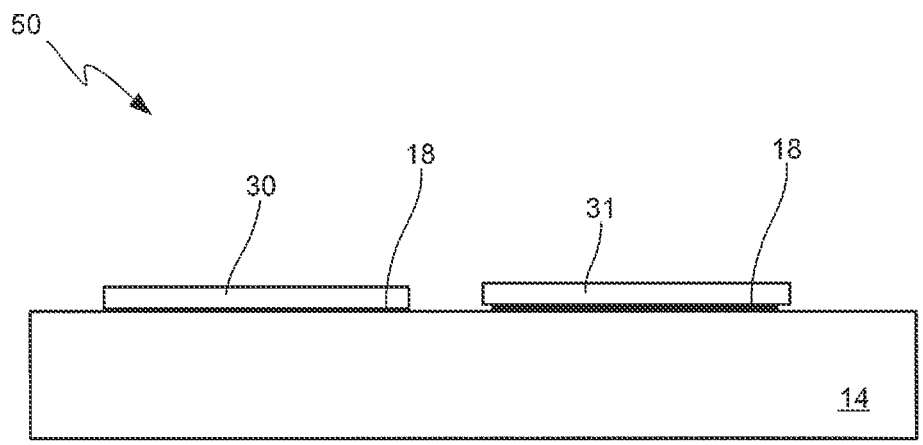
FIG. 2A illustrates in side cross-sectional view an example pair of electroadhesive gripping surfaces having single electrodes thereon.
Figure 2B:
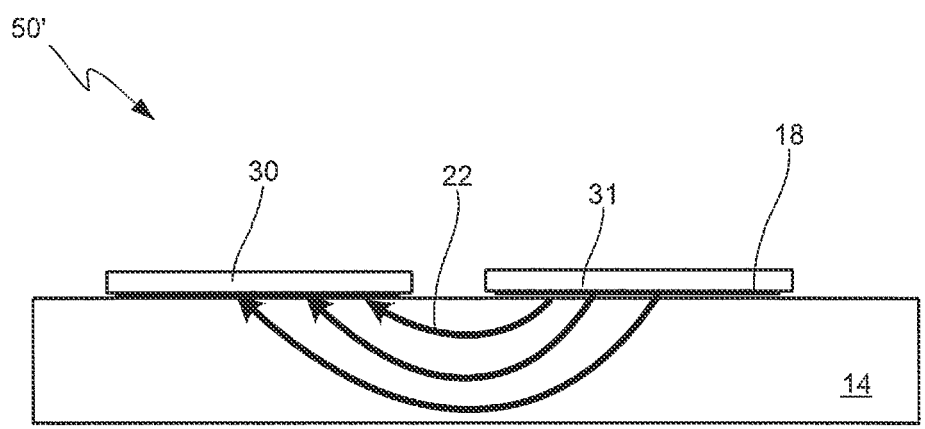
FIG. 2B illustrates in side cross-sectional view the example pair of electroadhesive gripping surfaces of FIG. 2A with voltage applied thereto.

Referring to FIGS. 2A and 2B, an example pair of electroadhesive devices or gripping surfaces having single electrodes thereon is shown in side cross-sectional view. FIG. 2A depicts electroadhesive gripping system 50 having electroadhesive devices or gripping surfaces 30, 31 that are in contact with the surface of a foreign object 16, while FIG. 2B depicts activated electroadhesive gripping system 50' with the devices or gripping surfaces having voltage applied thereto. Electroadhesive gripping system 50 includes two electroadhesive devices or gripping surfaces 30, 31 that directly contact the foreign object 16. Each electroadhesive device or gripping surface 30, 31 has a single electrode 18 coupled thereto. In such cases, the electroadhesive gripping system can be designed to use the foreign object as an insulation material. When voltage is applied, an electric field 22 forms within foreign object 14, and an electrostatic force between the gripping surfaces 30, 31 and the foreign object is created. Various embodiments that include numerous of these single electrode electroadhesive devices can be used, as will be readily appreciated.

In some embodiments, an electroadhesive gripping surface can take the form of a flat panel or sheet having a plurality of electrodes thereon. In other embodiments, the gripping surface can take a fixed shape that is matched to the geometry of the foreign object most commonly lifted or handled. For example, a curved geometry can be used to match the geometry of a cylindrical paint can or soda can. The electrodes may be enhanced by various means, such as by being patterned on an adhesive device surface to improve electroadhesive performance, or by making them using soft or flexible materials to increase compliance and thus conformance to irregular surfaces on foreign objects.

Figure 3A:
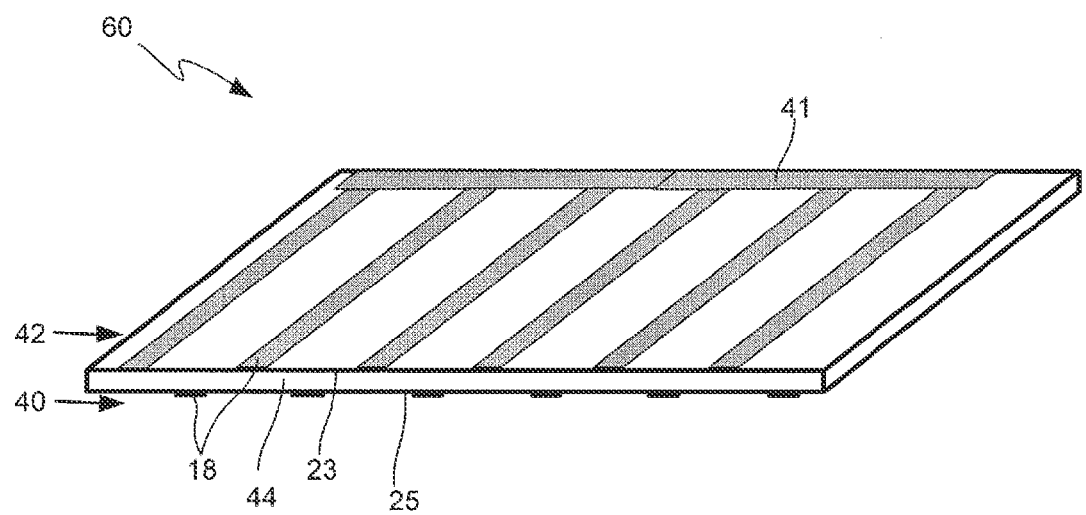
FIG. 3A illustrates in top perspective view an example electroadhesive gripping surface in the form of a sheet with electrodes patterned on top and bottom surfaces thereof.
Figure 3B:
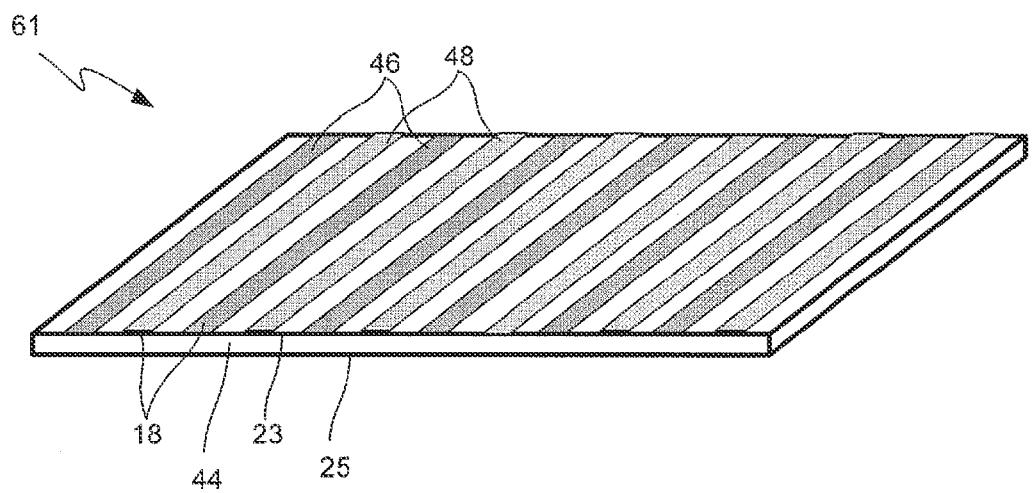
FIG. 3B illustrates in top perspective view another example electroadhesive gripping surface in the form of a sheet with electrodes patterned on a single surface thereof.

Turning next to FIGS. 3A and 3B, two examples of electroadhesive gripping surfaces in the form of flat panels or sheets with electrodes patterned on surfaces thereof are shown in top perspective view. FIG. 3A shows electroadhesive gripping surface 60 in the form of a sheet or flat panel with electrodes 18 patterned on top and bottom surfaces thereof. Top and bottom electrodes sets 40 and 42 are interdigitated on opposite sides of an insulating layer 44. In some cases, insulating layer 44 can be formed of a stiff or rigid material. In some cases, the electrodes as well as the insulating layer 44 may be compliant and composed of a polymer, such as an acrylic elastomer, to increase compliance. In one preferred embodiment the modulus of the polymer is below about 10 MPa and in another preferred embodiment it is more specifically below about 1 MPa. Various known types of compliant electrodes are suitable for use with the devices and techniques described herein, and examples are described in U.S. Pat. No. 7,034,432, which is incorporated by reference herein in its entirety and for all purposes.

Electrode set 42 is disposed on a top surface 23 of insulating layer 44, and includes an array of linear patterned electrodes 18. A common electrode 41 electrically couples electrodes 18 in set 42 and permits electrical communication with all the electrodes 18 in set 42 using a single input lead to common electrode 41. Electrode set 40 is disposed on a bottom surface 25 of insulating layer 44, and includes a second array of linear patterned electrodes 18 that is laterally displaced from electrodes 18 on the top surface. Bottom electrode set 40 may also include a common electrode (not shown). Electrodes can be patterned on opposite sides of an insulating layer 44 to increase the ability of the gripping surface 60 to withstand higher voltage differences without being limited by breakdown in the air gap between the electrodes, as will be readily appreciated.

Alternatively, electrodes may also be patterned on the same surface of the insulating layer, such as that which is shown in FIG. 3B. As shown, electroadhesive gripping surface 61 comprises a sheet or flat panel with electrodes 18 patterned only on one surface thereof. Electroadhesive gripping surface 61 can be substantially similar to electroadhesive gripping surface 60 of FIG. 3A, except that electrodes sets 46 and 48 are interdigitated on the same surface 23 of a compliant insulating layer 44. No electrodes are located on the bottom surface 25 of insulating layer 44. This particular embodiment decreases the distance between the positive electrodes 18 in set 46 and negative electrodes 18 in set 48, and allows the placement of both sets of electrodes on the same surface of electroadhesive gripping surface 61. Functionally, this eliminates the spacing between the electrodes sets 46 and 48 due to insulating layer 44, as in embodiment 60. It also eliminates the gap between one set of electrodes (previously on bottom surface 25) and the foreign object surface when the top surface 23 adheres to the foreign object surface. In some cases, the top (electrode) surface 23 may be further coated with an insulating material (not shown) so that the electrode sets 46 and 48 are completely sandwiched (e.g., encapsulated) between insulating materials. Although either embodiment 60 or 61 can be used, these changes in the latter embodiment 61 provide relatively greater electroadhesive forces between electroadhesive gripping surface 61 and the subject foreign object to be handled due to the closer proximity of both sets of electrodes 46, 48 to the foreign object surface.

In some embodiments, an electroadhesive device or gripping surface may comprise a sheet or veil type grasper that is substantially flexible in nature. In such embodiments, either no backing structure or a substantially flexible backing structure can be used, such that all or a portion of the veil type end effector or gripping surface can substantially flex or otherwise conform to a foreign object or objects, as may be desired for a given application. Creating electroadhesive grippers that facilitate such conforming or compliance to a foreign object can be achieved, for example, by forming the electroadhesive layer or gripping surface out of thin materials, by using foam or elastic materials, by butting out flaps or extensions from a primary electroadhesive sheet, or by connecting the sheet only at a few selected underlying locations, rather than to an entire rigid backing, among other possibilities.

Although the foregoing exemplary embodiments for electroadhesive gripping surfaces in the form of flat panels or sheets depict bars or stripes for electrodes, it will be understood that any suitable pattern for electrodes could also be used for such a sheet-type electroadhesive gripping surface. For example, a sheet-type electroadhesive gripping surface could have electrodes in the form of discrete squares or circles that are distributed about the sheet and polarized in an appropriate manner, such as in an evenly spaced "polka-dot" style pattern, Other examples such as two sets of electrodes patterned as offset spirals, can also be used. As one particular example, where a thin and flexible material is used for the insulating layer, such as a polymer, and where electrodes are distributed thereabout in the form of discrete discs, a resulting flexible and compliant electroadhesive gripping surface "blanket" would be able to conform to the irregular surfaces of a relatively large object while providing numerous different and discrete electroadhesive forces thereto during voltage application.

2c) Deformable Gripping Surfaces

Figure 4A:
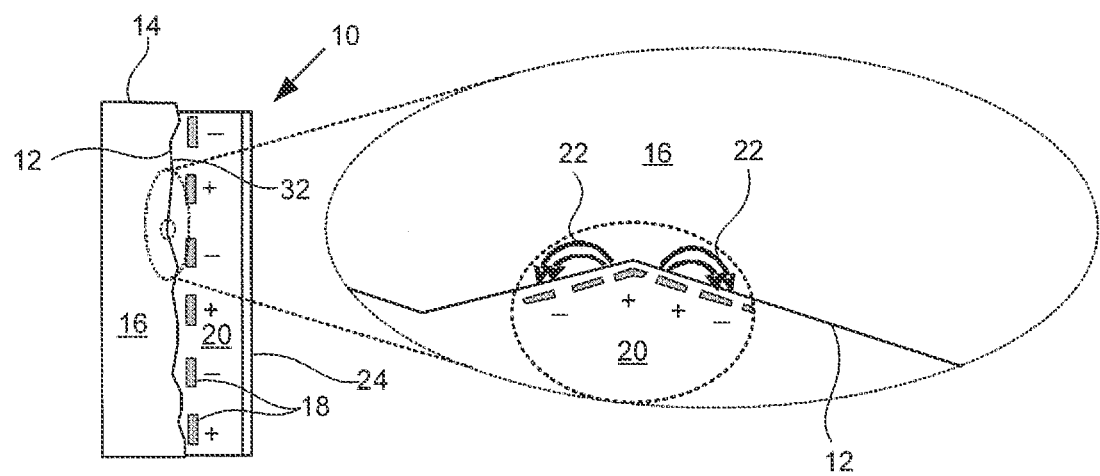
FIG. 4A illustrates in side cross-sectional views an example deformable electroadhesive device conforming to the shape of a rough surface.
Figure 4B:
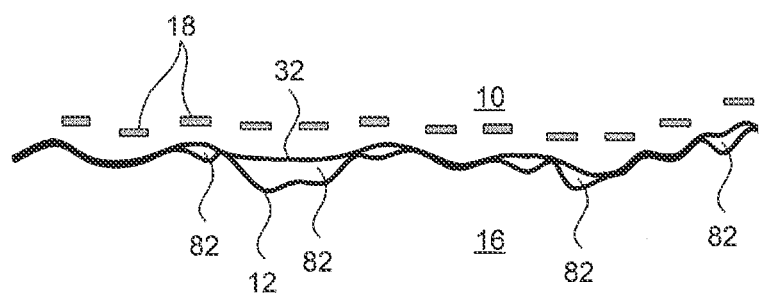
FIG. 4B illustrates in partial side cross-sectional view a surface of an example deformable electroadhesive device initially when the device is brought into contact with a foreign surface.
Figure 4C:
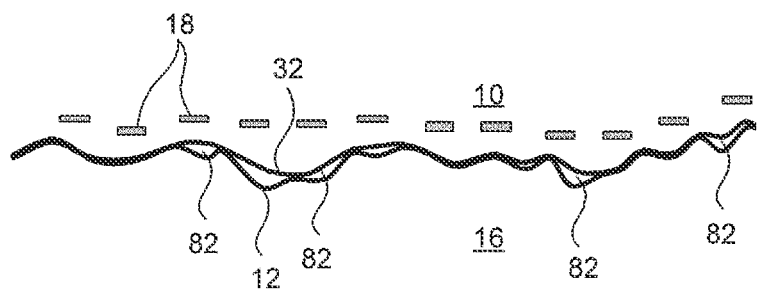
FIG. 4C illustrates deformation in the electroadhesive device of FIG. 4B due to electrostatic attraction and compliance.

Another feature of electroadhesive devices described herein is the option to use deformable surfaces and materials in electroadhesive device 10 as shown in FIGS. 4A-4C. In one embodiment, one or more portions of electroadhesive device 10 are deformable. In a specific embodiment, this includes surface 32 on device 10. In another embodiment, insulating material 20 between electrodes 18 is deformable. Electroadhesive device 10 may achieve the ability to deform using material compliance (e.g., a soft material as insulating material 20) or structural design (e.g., see cilia or hair-like structures). In a specific embodiment, insulating material 20 includes a bendable but not substantially elastically extendable material (for example, a thin layer of mylar). In another embodiment insulating material 20 is a soft polymer with modulus less than about 10 MPa and more specifically less than about 1 MPa. Stiffer or softer materials can also be readily used, depending on the particular application.

Electrodes 18 may also be compliant. Compliance for insulating material 20 and electrodes 18 may be used in any of the electroadhesive device arrangements 10 described above. Compliance in electroadhesive device 10 permits an adhering surface 32 of device 10 to conform to features in surface 12 of the object 14 it attaches to. Compliance can also be related to the ability to passively adhere to foreign objects using van der Waals forces. FIG. 4A shows a compliant electroadhesive device 10 conforming to the shape of a rough surface 12 in accordance with a specific embodiment of the present disclosure.

Adhering surface 32 is defined as the surface of an electroadhesive device that contacts the substrate surface 12 being adhered to. The adhering surface 32 may or may not include electrodes. In one embodiment, adhering surface 32 includes a thin and compliant protective layer that is added to protect electrodes that would otherwise be exposed. In another embodiment, adhering surface 32 includes a material that avoids retaining debris stuck thereto (e.g., when electrostatic forces have been removed). Alternatively, adhering surface 32 may include a sticky or adhesive material to help adhesion to a wall surface or a high friction material to resist sliding with respect to the adhering surface 32 for a given normal force.

Compliance of electroadhesive device 10 often improves adherence. When both electrodes 18 and insulating material 20 are able to deform, the adhering surface 32 may conform to the contours of a rough surface 12, both initially and dynamically after initial charge has been applied. This dynamic compliance is described in further detail with respect to FIG. 4B. This surface compliance enables electrodes 18 to get closer to surface 12, which increases the overall clamping force provided by the electroadhesive device 10. In some cases, electrostatic forces may be inversely proportional to distance squared (e.g., the distance between electrodes 18 and the surface 12). The compliance in electroadhesive device 10, however, permits device 10 to establish, dynamically improve, and maintain intimate contact with surface 12 of object 14, thereby increasing the applied holding force applied by the electrodes 18. The added compliance can also provide greater mechanical interlocking on a micro scale between surfaces 12 and 32 to increase the effective friction and inhibit sliding.

The compliance permits electroadhesive device 10 to conform to the surface 12 both initially and dynamically after electrical energy has been applied. This dynamic method of improving electroadhesion is shown in FIGS. 4B and 4C in accordance with another embodiment of the present invention. FIG. 4B shows a surface 32 of electroadhesive device 10 initially when the device 10 is brought into contact with surface 12 of a structure with material 16. Surface 12 may include roughness and non-uniformities on a macro, or visible, level (for example, the roughness in concrete can easily be seen) as well as a microscopic level (most materials).

At some time when the two are in contact as shown in FIG. 4B, electroadhesive electrical energy is applied to electrodes 18. This creates a force of attraction between electrodes 18 and surface 12. However, initially, as a practical matter for most rough surfaces, as can be seen in FIG. 4B, numerous gaps 82 are present between device surface 32 and surface 12. The number and size of these gaps 82 affects electroadhesive clamping pressures. For example, at macro scales electrostatic clamping is inversely proportional to the square of the distance between the substrate 16 and the charged electrodes 18 (which includes the distance of the gaps 82). Also, a higher number of electrode sites allows device surface 32 to conform to more local surface roughness and thus improve overall adhesion. At micro scales, though, the increase in clamping pressures when the gap 82 is reduced is even more dramatic. This increase is due to Paschen's law, which states that the breakdown strength of air increases dramatically across small gaps. Higher breakdown strengths and smaller gaps imply much higher electric fields and therefore much higher clamping pressures. Clamping pressures may be increased, and electroadhesion improved, by using a compliant surface 32 of electroadhesive device 10, or an electroadhesion mechanism that conforms to the surface roughness.

When the force of attraction overcomes the compliance in electroadhesive device 10, these compliant portions deform and portions of surface 32 move closer to surface 12. This deformation increases the contact area between electroadhesive device 10 and surface 12, increases electroadhesion clamping pressures, and provides for stronger electroadhesion between device 10 and object 14. FIG. 4C shows the surface shape of electroadhesive device 10 and surface 12 after some deformation in electroadhesive device 10 due to the initial force of electrostatic attraction and compliance. Many of the gaps 82 have become smaller.

This adaptive shaping may continue. As the device surface 32 and surface 12 get closer, the reducing distance in many locations further increases electroadhesion forces, which causes many portions of electroadhesive device 10 to further deform, thus bringing even more portions of device surface 32 even closer to surface 12. Again, this increases the contact area, increases clamping pressures, and provides for stronger electroadhesion between device 10 and object 14. The electroadhesive device 10 reaches a steady state in conformance when compliance in the device prevents further deformation and device surface 32 stops deforming.

In some embodiments, electroadhesive device 10 includes porosity in one or more of electrodes 18, insulating material 20 and backing 24. Pockets of air may be trapped between surface 12 and surface 32; these air pockets may reduce adaptive shaping. Tiny holes or porous materials for insulator 20, backing 24, and/or electrodes 18 allows trapped air to escape during dynamic deformation. Thus, electroadhesive device 10 is well suited for use with rough surfaces, or surfaces with macroscopic curvature or complex shape. In one embodiment, surface 12 includes roughness greater than about 100 microns. In a specific embodiment, surface 12 includes roughness greater than about 3 millimeters.

An optional backing structure 24, such as shown in FIGS. 1A and 4A, can attach to insulating material 20 and include a rigid or non-extensible material. Backing layer or structure 24 can provide structural support for the compliant electroadhesive device. Backing layer 24 also permits external mechanical coupling to the electroadhesive device to permit the device to be used in larger devices, such as wall-crawling robots, gripping surfaces of robotic control arms, and other devices and applications.

With some electroadhesive devices 10, softer materials may warp and deform too much under mechanical load, leading to suboptimal clamping. To mitigate these effects, electroadhesive device 10 may include a graded set of layers or materials, where one material has a low stiffness or modulus for coupling to the wall surface and a second material, attached to a first passive layer, which has a thicker and/or stiffer material. Backing structure 24 may attach to the second material stiffer material. In a specific embodiment, electroadhesive device 10 included a polyurethane elastomer of thickness approximately 50 microns as the softer layer and a thicker polyurethane elastomer of thickness 1000 microns as the second support layer. Other thicknesses may be used. Further, other materials, such as acrylics, may also be used.

The time it takes for the changes of FIGS. 4B and 4C may vary with the electroadhesive device 10 materials, electroadhesive device 10 design, the applied control signal, and magnitude of electroadhesion forces. The dynamic changes can be visually seen in some electroadhesive devices. In one embodiment, the time it takes for device surface 32 to stop deforming can be between about 0.01 seconds and about 10 seconds. In other cases, the conformity ceasing time is between about 0.5 second and about 2 seconds.

In some embodiments, electroadhesion as described herein permits fast clamping and unclamping times and may be considered almost instantaneous. In one embodiment, clamping or unclamping may be achieved in less than about 50 milliseconds. In a specific embodiment, clamping or unclamping may be achieved in less than about 10 milliseconds. The speed may be increased by several means. If the electrodes are configured with a narrower line width and closer spacing, then speed is increased using conductive or weakly conductive substrates because the time needed for charge to flow to establish the electroadhesive forces is reduced (basically the "RC" time constant of the distributed resistance-capacitance circuit including both electroadhesive device and substrate is reduced). Using softer, lighter, more adaptable materials in device 10 will also increase speed. It is also possible to use higher voltage to establish a given level of electroadhesive forces more quickly, and one can also increase speed by overdriving the voltage temporarily to establish charge distributions and adaptations quickly. To increase unclamping speeds, a driving voltage that effectively reverses polarities of electrodes 18 at a constant rate may be employed. Such a voltage prevents charge from building up in substrate material 16 and thus allows faster unclamping. Alternatively, a moderately conductive material 20 can be used between the electrodes 18 to provide faster discharge times at the expense of some additional driving power required.

Various additional details and embodiments regarding electroadhesion, electrolaminates, electroactive polymers, wall-crawling robots, and applications thereof can be found at, for example, U.S. Pat. Nos. 6,586,859; 6,911,764; 6,376,971; 7,411,332; 7,551,419; 7,554,787; and 7,773,363; as well as International Patent Application No. PCT/US2011/029101; and also U.S. patent application Ser. No. 12/762,260, each of the foregoing of which is incorporated by reference herein.

2d) Soft Pad Materials

While the foregoing electroadhesive and electrostatic devices and systems are generally adequate for many applications, further improvements can also be quite useful. In many instances where electroadhesion is the only way by which two objects are being adhered, for example, then power loss, edge peeling and/or other issues can cause a loss of adhesion and possible failure. In certain applications, it may be helpful to conserve power during the attachment duration by providing a onetime power burst to initiate attachment with little or no power then to maintain attachment. Furthermore, the need for relatively high voltages to result in adequate electroadhesive forces can result in design constraints and greater chances for something to go wrong. In some arrangements then, the use of some secondary adhesion component, feature, or manner of adhesion in addition to the electroadhesion components and features can be beneficial.

Such arrangements can include the use of specialized materials, such as soft overlying dielectric insulator pads that facilitate electroadhesive attraction as well as other modes of attraction or adhesion between different objects. Specialized materials or methods of adhesion or attraction that allow for multiple modes of attraction or adherence between objects can result in stronger, more reliable and/or readily reversible adherence between separate objects, without overly demanding requirements with respect to increased voltages, high or constant power demands, safety concerns and other electrical details. Such specialized electrodes can involve the use of very low modulus materials (to provide vacuum or van der Waals forces), "artificial gecko" hairs (to provide van der Waals type forces), permanent adhesives such as UV curable or heat activated adhesives, or other similarly helpful materials and/or features in this regard.

In general, various approaches in using such specialized electrodes, interface layers, and/or other associated components that result in multiple modes of adherence or attraction can be to use very low modulus materials (e.g., 100 MPa or below or Shore 100 on A scale or below), or hairs such as gecko hairs to take advantage of van-der-waals forces, in addition to electroadhesion on a weight-holding device having a soft pad-like surface. In some applications, electroadhesion can act as a "switch" that forces the pad material into very close and uniform contact with the substrate without the typical need for a mechanical pressing or smoothing force. Once the "soft pad" electrode or interface layer is in intimate contact, a lot of the load bearing capacity can then come from van-der-waals forces or surface to surface adhesion forces, which are generally mechanical or passive in nature (i.e., not electrically applied). Electroadhesion can also keep the surfaces pressed together for a long period of time, which might not be possible if pursuing only the passive approach. Such a "soft pad" electrode or interface may also include a rigid or inelastic (but flexible in bending) backing material.

In addition, one can use weak glue materials or meltable glues at the pad substrate interface to increase adhesion and/ or conformity with the substrate. In such cases, the electroadhesive electrodes can also include high-resistance electrodes or discrete heater coils embedded along with them. The material on top of these electrodes can be monolithic (i.e., the entire layer melts when the heater coils are energized), or they can be discrete materials formed directly overlapping with the heater electrodes (such as where the material on top of the rest of the electroadhesive electrode is optimized for electroadhesion and the material on top of the heater electrode is optimized for its melting or adhesive properties). Such a combined arrangement may be useful in robotic attachment to a foreign body. A reversible attachment may be advantageous when the attachment is first made, so that it can be switched off and repositioned if necessary. Once the right attachment position is confirmed, a thermoplastic material can be melted in a few places to make a permanent secure attachment. The electroadhesive forces may help with the bonding of the thermoplastic by maintaining pressure through the cure process. Other modes of curing, such as ultraviolet or moisture, can also be used in conjunction with electroadhesion.

The various embodiments and variations thereof described herein provide example devices and systems that can be easy to install, as well as methods to hold relatively much stronger loads, even at an offset distance of few inches away from the electroadhesive soft pad, while also having the ability to hold or adhere with the power off during pulse cycling or even over a certain extended period of time. These embodiments enable a range of new applications, such as, for example, temporary exhibits of merchandise in a store, art in a gallery or museum, holiday decorations in a home, holding items in place during construction or fabrication processes, attaching tracking devices for surveillance, as well as others too numerous to list here.

Figure 5A:
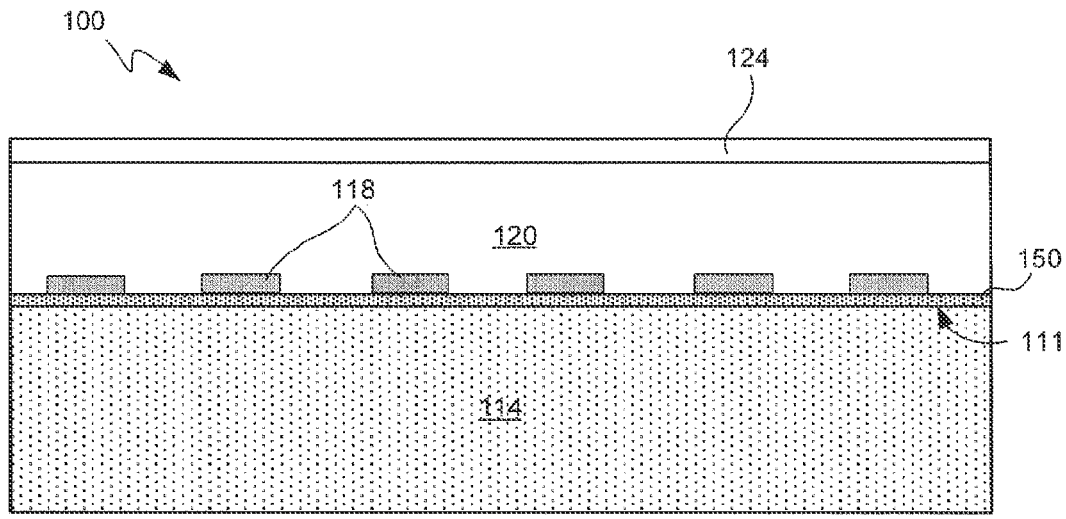
FIG. 5A illustrates in elevated cross-sectional view an example electroadhesive device having a base surface adhered to a foreign object.

Turning next to FIG. 5A, an exemplary electroadhesive device having a base surface adhered to a foreign object according to one embodiment is illustrated in elevated cross-sectional view. Electroadhesive device 100 can have a number of components that facilitate adherence to foreign object or substrate 114, and it will be readily appreciated that the orientation, alignment and/or arrangement of the device and foreign object can vary in numerous other ways. The electroadhesive device 100 can include various optional components, such as a bendable but not extendable backing plate 124. In some embodiments, backing plate 124 can be, for example, about 0.005 to 0.25 inches thick, with a Young's modulus of about 10-10,000 MPa. In addition, an optional filler material 120 can be used between backing plate 124 and surface 111, and arranged to surround one or more electrodes 118, which electrode(s) are adapted to generate an electroadhesive force, as noted above. Optional filler material 120 can similarly be, for example, about 0.005 to 0.25 inches thick, with a Young's modulus of about 10-10,000 MPa.

Electroadhesive device 100 can also include an interface layer 150 formed from a relatively soft semiconductor or insulator material, which is adapted to conform to the minute surface features on the foreign object or substrate 114. In some embodiments, interface layer can be, for example, about 0.005 to 0.25 inches thick, with a Young's modulus of about 10-1000 MPa. Specific material examples for such an interface layer can include, for example, quick casting polyurethane resins from Tap Plastics, proprietary low durometer polymers such as SORBOTHANE®, or silicones with conductive fillers or nitrile rubbers, among other possibilities. In various embodiments, such as where interface layer 150 directly contacts the foreign object or substrate 114, this interface layer can function as a base surface that interacts with the foreign object, is adapted to facilitate the application of the electrostatic force, and is also adapted to facilitate maintaining the current position of the electrostatic device relative to the foreign object in a secondary manner that is separate from the electrostatic force. Such a secondary manner or force can involve suction or a vacuum, van der Waals, and/or glue or other adhesive forces.

In some embodiments, an optional interface material 111 can be located right at the bottom surface of interface layer 150, such that this optional interface material directly contacts the surface of foreign object or substrate 114, and thus all the features and irregularities on that surface. Optional surface material can include, for example, a low durometer coating, such as silicone, "artificial gecko" like hairs, a relatively weak glue or other adhesive, a meltable adhesive, a phase changing adhesive material, or any of a number of other possible materials. Such an optional surface material on top of these electrodes can be monolithic. In such cases, the material can be optimized for the combination of electroadhesion and the secondary force. For example, the material can be mildly conductive for best electroadhesive performance and low durometer for higher van der Waals forces. Alternatively, the filler material or interface materials can be discrete materials that are composite and formed next to each other. For example, the material directly overlapping with heater electrodes can be optimized for melting and physical adhesion, while the rest of the material above the electroadhesive electrode is optimized for electroadhesion.

Figure 5B:
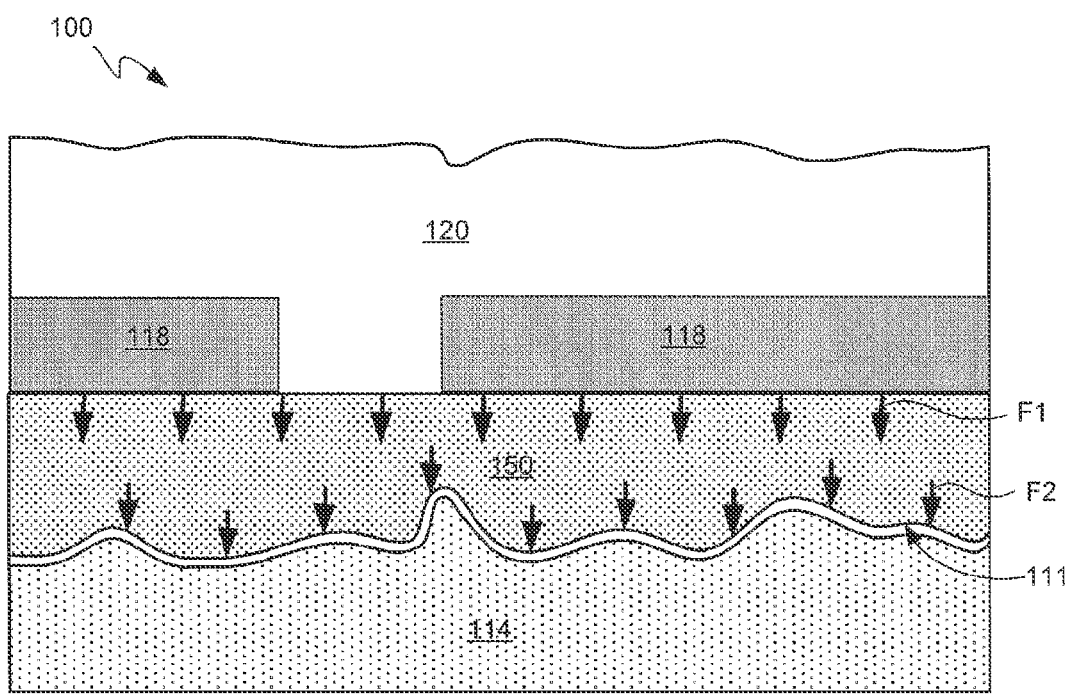
FIG. 5B illustrates in close-up elevated cross-sectional view the example electroadhesive device of FIG. 5A.

Moving next to FIG. 5B, the exemplary electroadhesive device having a base surface of FIG. 5A is shown in close-up elevated cross-sectional view. In particular, various surface features and irregularities that may be naturally or ordinarily found on foreign object or substrate 114 may be somewhat exaggerated for purposes of discussion. Again, electroadhesion forces can be generated between device 100 and the foreign object 114 by way of one or more electrodes 118. Such electrostatic forces are generally shown in FIG. 5B as F1, which represents the electrostatic force caused between the entire device 100 and object 114 caused by voltage differences across the electrode(s) 118. In addition, one or more secondary forces are generally shown as F2, which can be caused in one or more additional manners or mechanisms. For example, F2 forces can be vacuum forces where a low durometer rubber or silicone is used as a contact material, van der Waals forces that are caused due to gecko like hairs as a contact material, or adhesion forces due to a relatively weak glue, such as that used on Post-it Notes® by 3M, or due to a meltable or other phase changing adhesive, such as wax.

In such embodiments involving a surface adhesion force F2, the electroadhesion force F1 can enhance or increase the passive force F2 without the application of mechanical smoothing, mechanical pressure, or other types of mechanical interaction that are typically required for such F2 forces. Furthermore, the surface adhesion force F2 is additive to the electroadhesion force F1, and as such the combination of F1 and F2 provides offers better coupling or adhesion to the foreign object or substrate 114. In addition, embodiments that include an optional surface interface material 111 or other surface feature such as a glue, other adhesive, gecko like hairs, elastomer, or the like, such material or materials tends to fill in any small cavities or spaces between the device and the foreign object.

Figure 6:
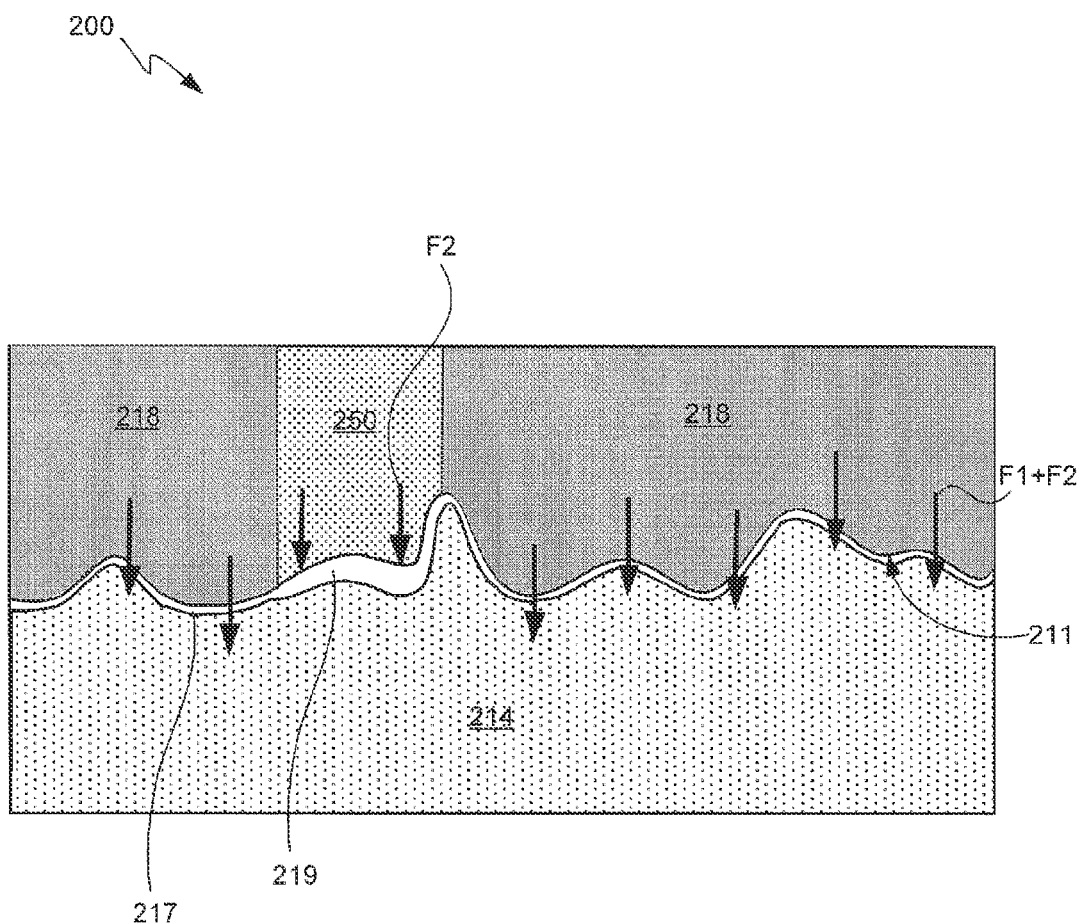
FIG. 6 illustrates in close-up elevated cross-sectional view another example electroadhesive device having electrodes with base surfaces adhered to a foreign object.

In addition, in order to achieve better electroadhesion forces where a relatively thick insulator material is used for interface layer 150, certain electrical properties may be preferable for such an insulator material. In particular, a bulk resistance of 1 megaohm-m (MΩ/m) to 100 gigaohm-meters (GΩ/m), and a surface resistance of more than $10^{13}$ ohms per square meter may be preferable. Furthermore, without wishing to be bound by theory, these electrical properties may allow the electrodes to transmit their voltages closer to the substrate surface, thus allowing Johnson-Rahbeck effect electrostatic clamping even with thick (50-1000 micrometer) insulation interface layers 150. Continuing with FIG. 6, an example alternative electroadhesive device having electrodes with base surfaces adhered to a foreign object is also depicted in close-up elevated cross-sectional view. Electroadhesive device or system 200 is similar to electroadhesive device or system 100 above, in that it has one or more electrodes 218 adapted to generate electroadhesive forces F1 between the device or system 200 and a foreign object or substrate 214. Again, various surface features and irregularities that may be naturally or ordinarily found on foreign object or substrate 214 may be somewhat exaggerated for purposes of illustration. Unlike the foregoing embodiment 100, however, device 200 includes one or more electrodes 218 that can directly contact the foreign object 214. In effect, electrodes 218 can be embedded within interface material 250.

Although somewhat different since the electrode(s) 218 can directly contact the foreign object 214 and/or be embedded within an interface material 250, device 200 is similarly arranged to result in one or more secondary forces F2, which can again be caused by one or more additional manners or mechanisms. Such additional manners or mechanism can be the same or similar to those described above, and can be in the form of an optional thin surface interface material or feature 211, such as glue, gecko hairs, low durometer rubbers or silicones, and the like. Such materials or features 211 can be located at the surfaces of both the electrodes 218 and the interface material 250 that may be between the electrodes. As shown, secondary forces F2 might then occur all across the surface interface between device 200 and foreign object 214, while electroadhesive forces F1 might only occur at or near where electrodes 218 are located. As will be readily appreciated, in the event that electrodes 218 are spaced closely enough together, F1 forces might exist at all locations as well.

Due to the addition of significant F2 type adhesion forces in both of the foregoing embodiments, as well as numerous other suitable alternative embodiments that will be readily appreciated, the ability to provide, vary, increase, pulse and otherwise manipulate or even remove the electrostatic or electroadhesion voltage or associated power source without an overall loss of adhesion can advantageously be observed. In fact, an electroadhesion voltage could be applied in a much wider variety of ways given the presence of such F2 secondary forces. For example, the electroadhesion voltage could be applied continuously (as in a traditional manner), applied only initially at the time of attachment (and then removed), applied intermittently, such as pulsed at a set frequency or on demand upon a feedback sensing of a weakening F2 force, or in some combination of ways.

For example, with intermittent use of electroadhesion forces (i.e., F1), these forces could be just enough to maintain the higher end of the secondary force (i.e., F2). As a particular example, the COMMAND™ type hooks by 3M can provide an F2 type force, but come with a warning that the hooks may come undone under too heavy a load. In such instances, an intermittent application of an electroadhesive force (F1) would increase the likelihood that such a hook stays on the wall. As another example of attachment using purely van der Waals forces (F2), continuous loading can cause deformation in soft materials. While this can in turn ordinarily result in gradual detachment over time, the application of an added electroadhesive force (F1) could press the material such that it remains in intimate contact with the substrate at all times. As yet another example, a meltable glue arrangement can involve an electroadhesive force (F1) that causes an added glue (F2) to flow and fill in the cavities and gaps between surface features on the foreign object 214.

Figure 7A:
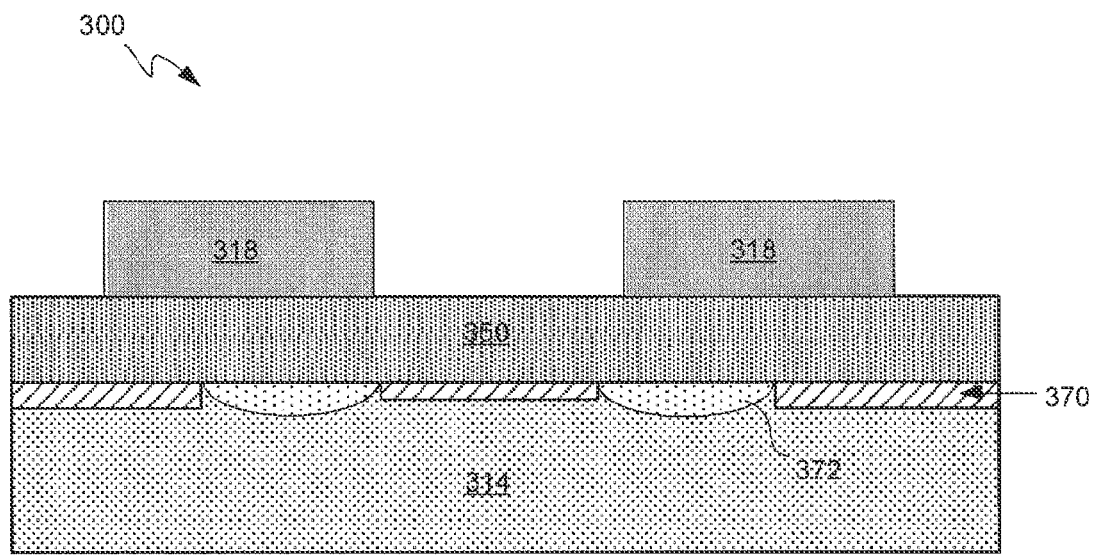
FIG. 7A illustrates in elevated cross-sectional view an example electroadhesive system having an electroadhesion component and a secondary adhesion component adapted to adhere separate objects together.
Figure 7B:
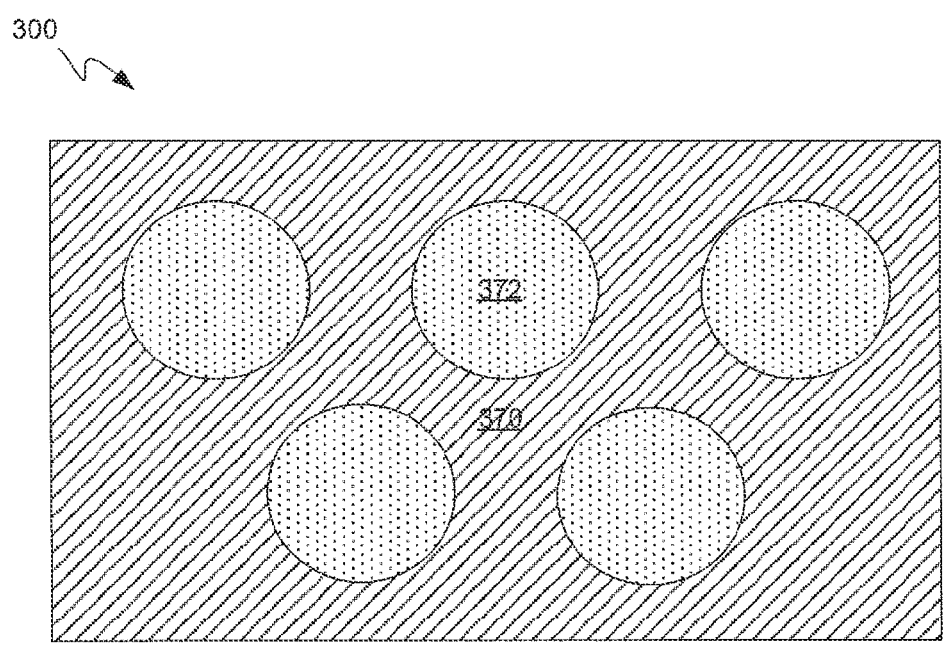
FIG. 7B illustrates in top cross-sectional view the example electroadhesive system of FIG. 7A.

FIG. 7A illustrates in elevated cross-sectional view an example electroadhesive system having an electroadhesion component and a secondary adhesion component adapted to adhere separate objects together according to one embodiment of the present invention. In addition, FIG. 7B illustrates in top cross sectional view the example electroadhesive system of FIG. 7A at the level of interface layer or film 370. Electroadhesive device or system 300 includes one or more electrodes 318 adapted to generate electroadhesive forces between the device or system 300 and a foreign object or substrate 314. An optional electrical insulation layer 350 can be formed from a relatively soft semiconductor or insulator material, which can be, for example, about 0.005 to 0.25 inches thick, with a Young's modulus of about 10-1000 Mpa. Similar to the foregoing embodiments, specific material examples for such an interface layer can include, for example, quick casting polyurethane resins from Tap Plastics, proprietary low durometer polymers such as SORBOTHANE®, or silicones with conductive fillers or nitrile rubbers.

In addition, an interface layer or film 370 having a pattern of openings therethrough can be situated between insulation layer 350 and the foreign object 314. Interface layer 370 can be relatively thin, with a thickness of about 0.5 to 10 millimeters, for example. In various embodiments, interface layer 370 can be adapted to pass electroadhesion forces (F1) therethrough from electrodes 318 to object 314, such that device 300 is adhered to object 314 across layer 370. In addition, interface layer 370 can be similar to traditional electrostatic interface layers, in that it not necessarily well suited to provide by itself any additional secondary forces (F2) for adhering device 300 to object 314.

Rather, layer 370 can include a number of openings therethrough where suitable soft pad components or materials 372 can contact layer 350 (or optionally electrode(s) 318) and the surface of the foreign object 314. Unlike the interface layer 370, these soft pad regions 372 can include materials or features, such as those detailed above, that are suitable for generating significant secondary forces (F2) to adhere device 300 to object 314. In some embodiments, layer 350 or device 300 generally can be designed such that soft pad materials 372 form a continuous layer (not shown) that extends only through the openings in interface film 370, while in other embodiments, soft pad materials can be located only at such openings. The number and pattern of openings through interface film or mask 370 can be designed strategically such that secondary forces (F2) can be manipulated and/or focused at certain points or regions, as may be readily appreciated.

In various embodiments, these multiple soft pad regions 372 can function as base surfaces that interact with the foreign object, are adapted to facilitate the application of the electrostatic force, and are also adapted to facilitate maintaining the current position of the electrostatic device relative to the foreign object in a secondary manner that is separate from the electrostatic force. Again, such a secondary manner or force can involve suction or a vacuum, van der Waals, and/or glue or other adhesive forces.

In addition to the foregoing embodiments and examples, many other features and details may also be applied that result in an effective adhesion force that can be all electroadhesion, all secondary forces, or a combination thereof, which can vary over time and location as may be desired. As another possible example, a onetime permanent attachment feature can utilize a glue, wax, UV cure, phase changing material or other F2 type of permanent force that is enhanced during its application via the use of F1 type electroadhesive forces. Again, such F1 type forces can be used to minimize or eliminate the amount of mechanical pressing or smoothing forces that tend to be needed to apply a permanent adhesive in many instances.

III. Vacuum-Augmented Electroadhesive Gripping System

Gripping systems disclosed herein allow for selectively adhering to an object via a combination of vacuum forces and induced electrostatic attraction. Systems and devices disclosed herein include a flexible electroadhesive gripping surface that is applied to an object so as to induce a vacuum seal between the gripping surface and the object. The vacuum attraction can then supplement and/or replace electroadhesion to secure the object to the gripping surface. Such systems find application in automated and/or manual handling of smooth surfaces suitable for forming vacuum seal, such as sheets of glass or other smooth substrates.

In comparison with conventional vacuum seal systems, the present disclosure allows for sealing to dirty surfaces (e.g., dust covered glass) because the electroadhesion causes the flexible gripping surface to remain tightly sealed around particulates on the object or substrate. Electroadhesion also affords a relatively more resilient vacuum seal, because small gaps or air pockets formed due to transient stresses or peeling are self-corrected to reform the seal by the electroadhesion pulling the gripping surface back to the object. By contrast, conventional vacuum seals do not self-repair upon formation of air pockets between the sealing surface and the object. Thus, the vacuum-augmented electroadhesive systems and devices disclosed herein create adhesion with relatively greater strength and reliability in comparison to systems employing vacuum adhesion alone or electrostatic adhesion alone. The disclosed systems and devices therefore enables automated and/or manual item-handling operations to include higher speed maneuvers, to move heavier loads, and to be undertaken with relatively greater predictability and/or safety than conventional systems, among other advantages.

Figure 8A:
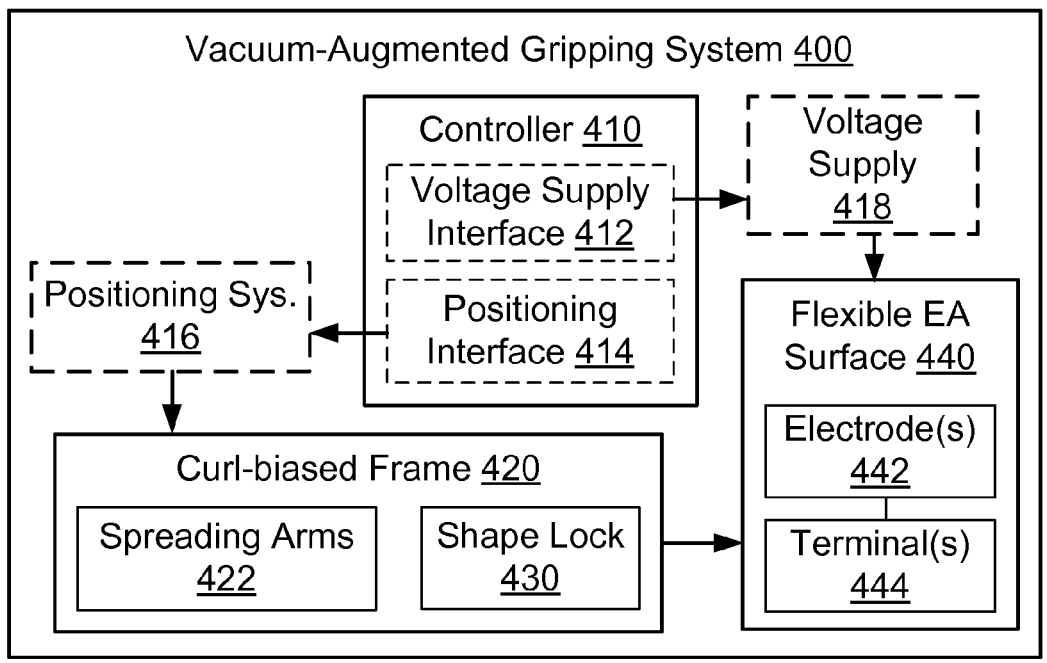
FIG. 8A illustrates an example vacuum-augmented electroadhesive gripper system.

FIG. 8A is a functional block diagram of a vacuum-augmented electroadhesive gripping system 400. The gripping system 400 includes a controller 410, a voltage supply 418, and a vacuum-augmented gripper, which can include a curl-biased load-bearing frame 420 and a flexible electroadhesive (EA) gripping surface 440. The voltage supply 418 can be configured to supply high DC voltages in a range of, for example, 0.5 kilovolt ("kV") to about 10 kV, similar to the electroadhesion voltages discussed above in connection with FIGS. 1-3. The electroadhesive gripping surface 440 includes integrated electrodes 442 connected to the voltage supply 418 via respective terminals 444. The electrodes 442 can be patterned in the gripping surface 440 according to a variety of different geometries within the platform surface and are generally arranged such that opposing polarity electrodes are situated adjacent one another. The electrodes 442 may be arranged with opposing polarity electrodes alternating one another (e.g., interdigitated electrodes), similar to the example electrode geometries described above in connection with FIGS. 1-3.

It is noted that the voltage supply 418 may generally be a power supply configured to output AC or DC voltages or currents sufficient to apply a polarizing voltage to the electrodes 442. For convenience in the description herein, the module 418 is therefore referred to as "voltage supply," although some embodiments may employ current supplies and/or other electrical power supplies. For example, current supplies may be tuned to provide currents suitable to generate a desired polarizing voltage in the electrodes 442.

The electroadhesive gripping surface 440 can be coupled to a load-bearing curl-biased frame 420 or other support structure, which can be a rigid or semi-rigid structure used to distribute forces exerted on the electroadhesive surface 440 caused by items adhered thereto. The frame 420 can include one or more spreading arms 422 and one or more curl-biased members. The frame 420 can be configured to flex between a curled shape and an uncurled shape by applying force to the curl-biased members via the spreading arms 422. Because the curl-biased frame 420 is coupled to the flexible electroadhesive gripping surface 440, changing the shape of the frame 420 (e.g., between curled and uncurled) also changes the shape of the gripping surface 440. For example, when the frame 420 is curled, the electroadhesive gripping surface 440 can have a convex curvature, and while the frame 420 is uncurled, the electroadhesive gripping surface 440 can be substantially flat. One example of a curl-biased frame is described below in connection with FIG. 9.

The curl-biased frame 420 can also include a shape locking mechanism 430. The shape locking mechanism 430 can take a variety of forms and operates to selectively fix the shape of the curl-biased frame 420 (and thus the shape of the gripping surface 440). For example, when engaged, the shape locking mechanism 430 can hold the spreading arms 422 in a position that causes the frame 420 to be in the uncurled position. When released, the shape locking mechanism 430 can allow the curl-biased frame 420 to return to a curled shape. In some examples, the shape locking mechanism 430 may include an electrically actuated clamp, a mechanical clip, a hydraulic element, or another device configured to hold the spreading arms 422 in position so as to fix the shape of the frame 420.

In some examples, the shape-changing capabilities of the curl-biased frame enable the gripping surface 440 to be applied to an item so as to induce a vacuum seal between the target item and the gripping surface 440. For example, the gripping surface may initially contact an item with a relatively small portion of the gripping surface. The initial contact may, for example, be with a central portion of the gripping surface. As the frame 420 uncurls, the region of the gripping surface in contact with the target item can progressively expand as additional portions of the gripping surface contact the target item. For example, as the frame 420 uncurls, a portion of the gripping surface immediately adjacent to the initial portion can contact the item next, and portions immediately adjacent those portions can contact the item next, and so on until the entire gripping surface contacts the target item. The progressive expansion of the interface between the gripping surface 440 and the target item produces a vacuum seal between the two, because air and other contaminants are directed out of the sealed interface by the uncurling motion of the gripping surface 440. Examples of such an uncurling seal mechanism and/or other shape-changing seal mechanisms are described further herein. In addition, some examples may include one or more valves within the gripping surface 440 for evacuating air from the sealing interface between the gripping surface 440 and the target item. For example, a pump and/or pressure regulator may be used apply a negative pressure to the valves, which creates suction at the valves and thereby tightens the vacuum bond between the gripping surface 440 and the target item.

The frame 420 may further include (or be coupled to) a backing, one or more support members, or other structural elements to allow the frame 420 to be manipulated via a positioning system 416. Moving the load-bearing frame 420 (e.g., via the positioning system 416) results in movement of the electroadhesive surface 440, and, by extension, any objects adhered to the electroadhesive surface 440. The load-bearing frame 420 can function to receive and/or redistribute stress forces on the electroadhesive gripping surface 440 to the structural members of the load-bearing frame 420 and/or to structural members associated with the positioning system 416. In some examples, a deformable layer couples the electroadhesive gripping surface 440 to the curl-biased frame 420. The deformable layer can then deform to thereby allow the gripping surface 440 to conform to exterior surfaces of objects adhered thereto. Such a deformable layer situated between the gripping surface 440 and the frame 420 may also distribute forces on the gripping surface 440 to the frame 420 and thereby enhance the load-bearing capacity of the gripping system 400.

In some cases, the curl-biased frame 420 may be a slightly curved concave or convex shaped rigid plate (e.g., a bowl) that is capable of flexing. For example, the curl-biased frame 420 may be a stiff bowl that elastically deforms, under force, to become a flat plate, and then relaxes in the absence of the flattening force to return to the curved bowl shape. In this case, the positioning system 416 can be attached to the concave side of the attachment, such that the convex side can be pressed against the flat object 401 by the positioning system 416. The action of pressing down on such a curved frame against the smooth, flat object 401 causes the frame to automatically flex so as to flatten out against the substrate 401. In this case, the return (relaxation) of the rigid plate to the curved shape may be prevented by the electroadhesive attraction force between the electroadhesive surface 440 and the foreign object 401 as long as the electroadhesive voltage is applied. In other words, the electroadhesive attraction can be used to maintain the curl-biased backing 420 in its uncurled shape, and thereby maintains a vacuum seal with the object 401. When the electroadhesive voltage is turned off (or reduced), this electroadhesive force decreases rapidly, thus allowing the frame 420 to return to its curved shape. The renewed curvature of the frame 420 breaks the vacuum seal between the electroadhesive surface 440 and the foreign object 401 in the process by peeling the electroadhesive surface 440 away from the object 401 from the edges inward.

The controller 410 can include electronics and/or logic implemented as hardware and/or software modules to control operation of the vacuum-augmented gripping system 400. For example, the controller 410 can include a power supply interface 412 for controlling the voltage supply 418 whether to apply voltage to the electrodes 442 of the gripping surface 440. The voltage supply interface 412 may be configured to operate a switch (or switches) connecting the output of the voltage supply 418 to the terminals 444 of the gripping surface 440 (or perhaps switches within the voltage supply 418). Moreover, the voltage supply interface 412 may specify a magnitude of voltage to be applied to the electrodes 442. The voltage supply interface 412 may send instructions to cause the voltage supply 418 to adjust the magnitude of voltage output to the terminals 444. Upon receiving instructions, the voltage supply 418 can be configured to apply the specified voltage to conductive wires or lines connected to the terminals 444. The applied voltage can be a DC or AC voltage, which can provide opposing polarity on the electrodes 442 in the gripping surface 440 and thereby cause the gripping surface 440 to induce corresponding polarization in a foreign object loaded on the gripping surface 440. In some cases, a current supply that determines the appropriate current and corresponding voltage that produces intimate contact with the item being handled may be used to replace or augment the voltage supply 418. The polarized electrodes 442 and corresponding induced polarization of the loaded object results in an electroadhesive attraction between the gripping surface 440 and the foreign object. Using the voltage supply interface 412 to cause the voltage supply 418 to apply voltage to the terminals 444 can thus be considered turning on the electroadhesive gripping system 400. Similarly, causing the voltage to cease being applied to the terminals 444 (e.g., by turning off or disconnecting the voltage supply 418, or reducing the magnitude of the applied voltage, etc.) can be considered turning off the electroadhesive gripping system 400.

The controller 410 may also include a positioning interface 414 configured to control the position of the load-bearing frame 420 via instructions to the positioning system 416. For example, the controller 410 can instruct one or more position motors (e.g., servo motors, hydraulically driven arms, or the like) in the positioning system 416 to adjust the position of the load-bearing frame 420. The frame 420 is coupled to the gripping surface 440, so the positioning interface 416 can be used to control the location and/or orientation of the gripping surface 440. The positioning system 416 may also be used to cause the curl-biased frame 420 to change shape (e.g., by moving the spreading arms 422 such that the frame 420 transitions from a curled shape to an uncurled shape).

The controller 410 may also include an item sensor (not shown). The item sensor can include one or more sensors and/or detectors configured to output data indicative of a loading condition of the electroadhesive gripping system 400. For example, the item sensor may detect whether any foreign objects are adhered to (or proximate to) the electroadhesive gripping surface 440. The item sensor may include sensors to detect indications of surface capacitance, opacity, thermistor-based slip sensors, etc. The item sensor can output data indicating that an item is detected, and the data can be used by the controller 410 to determine instructions to send to the voltage supply 418 and/or positioning system 416. For example, the controller 410 can determine a voltage to be applied to the electrodes 442 (and/or whether to apply such a voltage) based on indication(s) from the item sensor. In some cases, an indication of initial contact with a target item by an initial portion of the gripping surface can be used to initiate a change in shape by the frame 420.

Figure 8B:
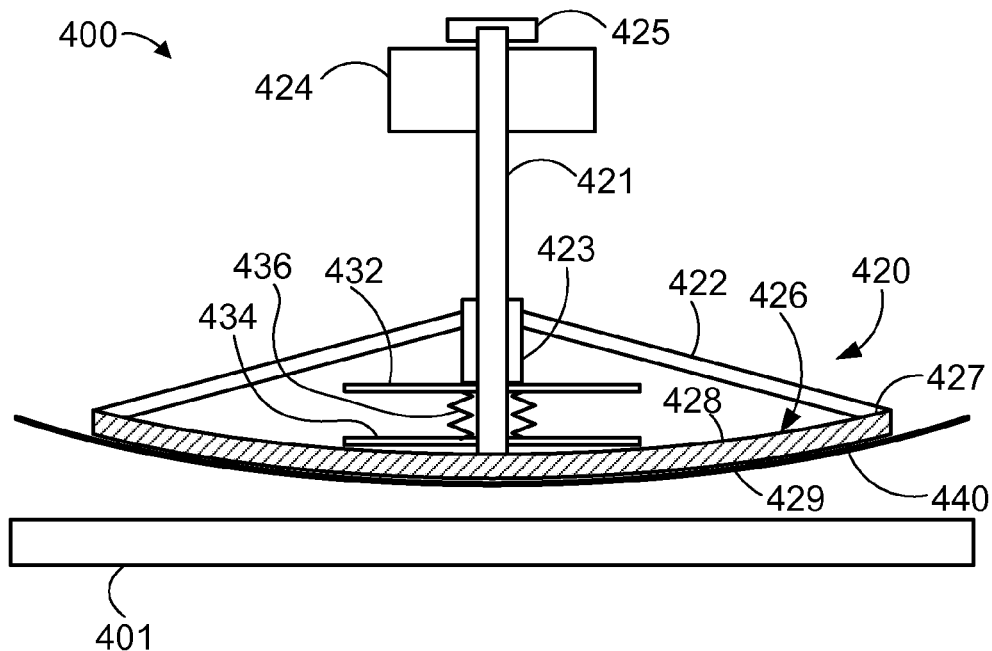
FIG. 8B illustrates a side cross-section view of an example vacuum-augmented electroadhesive gripper system.

FIG. 8B illustrates an example embodiment of the vacuum augmented electroadhesive gripping system 400. FIG. 8B illustrates a side cross-sectional view of the gripping system 400 approaching an object 401. An electroadhesive gripping surface 440 is coupled to a load-bearing curl-biased frame 420. The frame 420 includes a shaft 421 that couples spreading arms 422, via sliding collar 423, and a lifting sleeve 424. The spreading arms 422 are coupled to a shape-changing backing 426. The shape-changing backing is configured to change shape in response to force applied via the spreading arms 422 (e.g., force conveyed by the spreading arms 422 can change the backing 426 from a curled shape to an uncurled shape). The backing 426 is coupled to a backside of the electroadhesive gripping surface 440, and so a change in shape of the backing 426 corresponds to a change in shape of the gripping surface 440. The shaft 421 is also coupled to the backing 426 (e.g., near a central portion of the backing 426) such that movement of the sliding collar 423 along the shaft 421 moves the spreading arms 422 with respect to the backing 426 (or at least the region thereof anchored to the shaft 421). In FIG. 8B, the shaft 421 couples to the backing 426 near its center point. The spreading arms 422 also couple to the backing 426 at a distal end 427 of the backing 426. The distal end 427 can be near an edge (or edges) of the backing 426 and the shaft 421 may be coupled near the center of the backing 426.

The position of the spreading arms 422 (and thus the shape of the backing 426) can be fixed by holding the position of the sliding collar 423 on the shaft 421. Moving the sliding collar 423 toward the backing 426 (downward in the orientation of FIG. 8B), causes the spreading arms 422 to push the distal ends 426 outward away from the shaft 421, and toward the gripping surface 440 (downward in FIG. 8B). The downward motion of the sliding collar 423 thus uncurls the curled backing 426 toward a flat shape. Conversely, moving the sliding collar 422 upward along the shaft 421 causes the backing 426 to curl by a greater amount. To hold the spreading arms 422 in the uncurled position, an electroadhesive plate 434 fixed to the shaft 421 is configured to adhere to a corresponding plate 432 that is coupled to the sliding collar 423. The electroadhesive plate 434 can include one or more electrodes that induce an electrostatic attraction with the plate 432 when a polarizing voltage is applied thereto. The plate 432 slides with the sliding collar 423 along the shaft 421. A biasing spring 436 forces the two plates to be separated from one another and thus biases the backing 426 in the curled shape. Because the sliding plate is coupled to the sliding collar 423, the compression spring 436 pushes the sliding collar 423 away from the backing 426, and thereby causes the spreading arms 422 to bias the backing 426 in the curled shape.

A variety of other mechanisms can be used to hold the position of the sliding collar 423 on the shaft 421, such as a solenoid that forces the sliding collar 423 along the shaft 421, a ratcheting mechanism, a releasable clamp, a hydraulic device, a stepper motor, a motor with leadscrew, etc.

As shown in FIG. 8B, the frame 420 is in a curled shape, as indicated by the curvature of the backing 426 and the gripping surface 440. To facilitate the curled shape, the backing 426 has a compressible side 428 opposite a gripper adhered side 429. When the backing 426 is in the curled shape, the compressible side 428 has a shorter length than the gripper adhered side 420. The compressible side 428 may include notches (cut outs) oriented transverse to the direction of curvature, which allow the compressible side 428 to bend inward at the notches. The backing may also be configured such that it cannot bend outward beyond a flat shape (i.e., the compressible side 428 cannot become longer than the adhered side 429). As such, the frame 427 can be used to give a convex shape to the electroadhesive gripping surface 440, relative to the object 401, but not a concave shape. In FIG. 8B, notches (not visible) along the compressible side 428 are oriented into the page to facilitate the curling of the backing 426. To facilitate curling, the backing 426 may additionally or alternatively be formed from multiple sections laminated together, and the section(s) along the compressible side 428 may be formed of a material that is relatively more compressible (deformable) than the material on the gripper adhered side 429. Other examples are also possible to enable to compressible side 428 to have a shorter length than the gripper adhered side 429 and thereby cause the backing 426 to curl inward toward the compressible side 428.

The compressible side 428 may also include an elastic material that is under stress and pulls the compressible side 428 together. The compressible side 428 may then have a shorter length than the gripper adhered side 429, and the backing 426 may curl inward toward the compressible side 428. The elastic material can also bias the backing 426 in the curled shape. However, the backing 426 may be stretched to an uncurled shape using the spreading arms 422 to push the distal sides 427 down. In such an elastic configuration, the backing 426 can be biased in the curled shape without separately biasing the spreading arms 422. Additionally or alternatively, a backing that is configured to selectively change shape can be made using a shape memory alloy, electroactive polymers (EPAMs), linear actuators, etc. Without regard for the configuration of the backing 426, the curvature of the backing 426 can cause the gripping surface 440 to have a convex curvature. The convex curvature of the gripping surface 440 facilitates making initial contact with the object 401 with a relatively small portion of the gripping surface 440 (e.g., a region near the apex of the convex curvature, such as the region immediately below the shaft 421).

To uncurl the backing 426, the sliding collar 423 is pushed toward the backing 426 (downward in the orientation of FIG. 8B) while the gripping surface 440 makes contact with the object 401. Contact with the object 401 by the gripping surface 440 holds the shaft 421 in position, and the backing progressively uncurls from the center point outward as the sliding collar 423 descends. Force on the sliding collar 423 can be applied by the lifting sleeve 424 (e.g., via a lifting arm or other support member that manipulates the lifting sleeve 424 to slide down the shaft 421 and press downward on the sliding collar 423). Force on the sliding collar can also be applied by another device, such as a solenoid, hydraulic device, etc. The applied force is sufficient to overcome resistance from the compression spring 436. The two plates 432, 434 make contact (or become proximate to one another), and can then be held together by an electrostatic attraction between the electroadhesive plate 434 and the sliding plate 432. For example, a polarizing voltage applied to one or more electrodes in the electroadhesive plate 434 can induce a corresponding polarization in the plate 432, which results in electrostatic attraction between the plates. Upon turning off the applied voltage to the electroadhesive plate 434 (or reducing the voltage), the sliding plate 432 ceases to be adhered to the electroadhesive plate 432, and the compression spring 436 pushes the plates apart, which returns the spreading arms 422 to the uncurled position.

The actuation of the sliding collar 423 to uncurl the backing 426 (and thus the gripping surface 440) causes the gripping surface to form a vacuum seal against the surface of the object 401. The interface between the gripping surface 440 and the object 401 initially includes only an initial portion of the gripping surface, and then expands from the initial portion by smoothing the surface outward across the surface of the object 401 as the backing 426 uncurls. For example, following the initial contact with the object, the next contact between the gripping surface 440 and the object 401 is with a portion of the gripping surface 440 immediately adjacent the initial portion. In some cases, the outward smoothing proceeds as the backing 426 (and gripping surface 440) uncurls against the exterior surface of the object 401 such that each given portion of the gripping surface contacts the object 401 only after all portions of the gripping surface 440 intermediate to the given portion and the initial contacting portion also contact the object 401. The process of applying the gripping surface 440 to the object 401 as the backing 426 is uncurled thereby results in the evacuation of air and other contaminants from the interface between the gripping surface 440 and the object 401. Moreover, any contaminants, particulates, etc., that remain are rapidly contained by the electroadhesive gripping surface 440. An example process of such seal formation is described further in connection with FIG. 10.

On the other hand, the re-curling of the backing 426 upon termination of the electroadhesion facilitates breaking the vacuum seal. Upon release of the electroadhesive plates 434, 432, the compression spring 436 applies force on the sliding collar 423, which relieves the tension in the spreading arms 422, and thereby allows the backing 426 to return to the curled shape. The curling action causes the gripping surface 440 to lift away from the object 401 beginning at the edges (e.g., near the distal edge 427) and moving inward, toward the initial contacting portion of the gripping surface 440. The resulting outward to inward release from the object 401 peels the gripping surface 440 away from the object 401 without pulling against a vacuum sealed section.

3a) Frame with Curl-Biased Support Arms

Figure 9A:
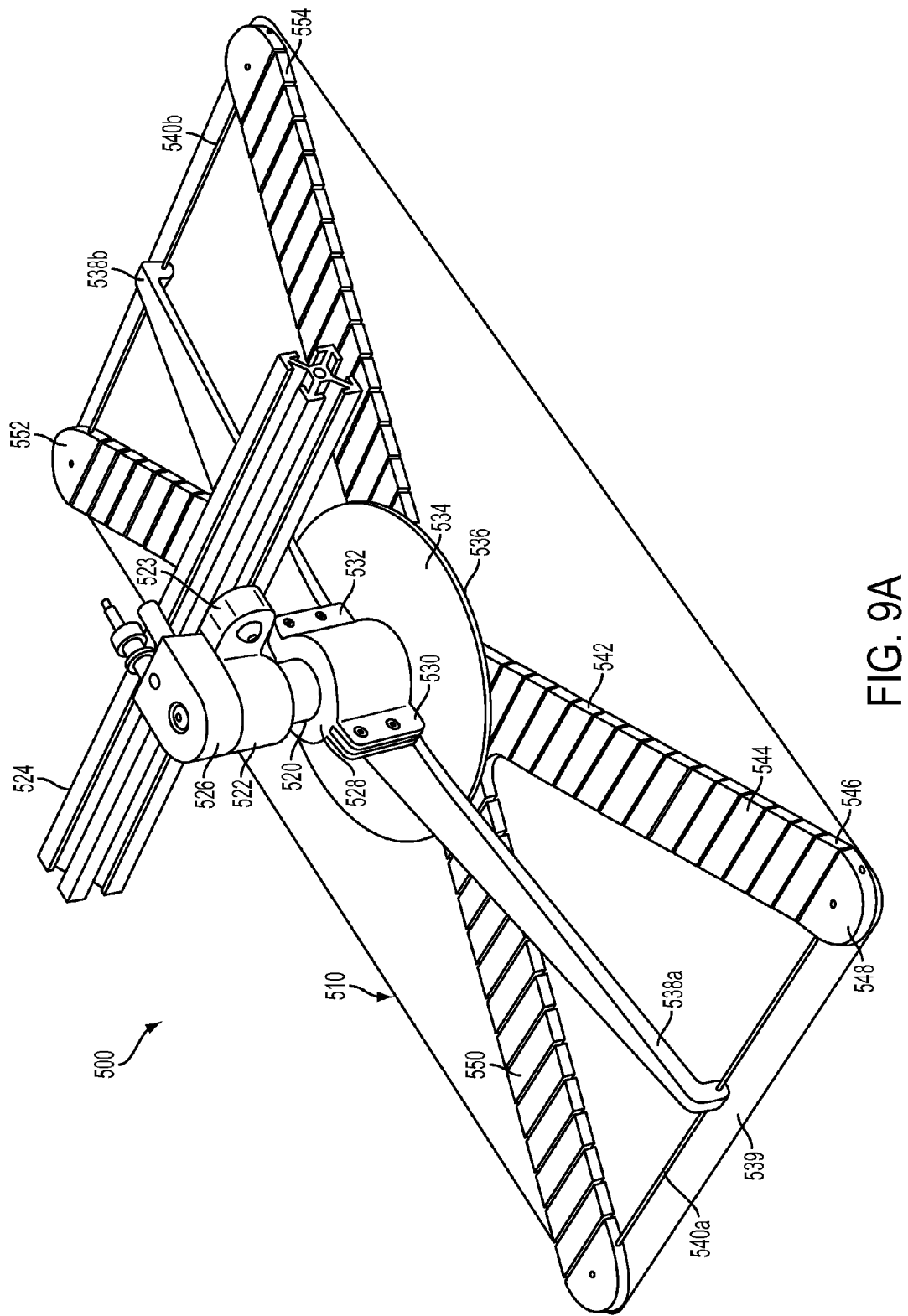
FIG. 9A illustrates in aspect view an example vacuum-augmented electroadhesive gripper.

FIG. 9A illustrates in aspect view an example vacuum-augmented electroadhesive gripper 500. The gripper 500 includes an electroadhesive gripping surface 510, a shaft 520, spreading arms 538a-b, and a shape-changing backing. The shaft 520 is also coupled to a lifting sleeve 522 with a mounting point 523 to a gantry 524 or other support member. The lifting sleeve 522 slides on the shaft 520 between a stop 526 situated at the end of the shaft 520 and a sliding collar 528. The sliding collar 528 includes connection points 530, 532 to the spreading arms 538a-b to allow the spreading arms 538a-b to move from curled position to an uncurled position. In the curled position, the sliding collar 528 moves upward along the shaft 520 so as to relieve tension on the backing and the gripping surface 510 via the spreading arms 538a-b. In the uncurled position (which is shown in FIG. 9A), the sliding collar 528 is moved downward along the shaft 520, toward the gripping surface 510, which stretches the backing radially outward, with respect to the axis of the shaft 510. In the uncurled position, the sliding collar 528 can be held in place by the electroadhesive plates 534, 536. The plate 534 can be coupled to the sliding collar 528 and configured to slide along the shaft 520. The plate 536 (not visible) can be fixed to the shaft 520 and can include electrodes that induce an electrostatic attraction with the sliding plate 534 upon application of voltage to the plate 536.

The gripping surface 510 includes electrodes configured to induce an electrostatic attraction between the gripping surface 510 and an object adhered thereto. In some cases, the electroadhesive gripping surface 510 and the electroadhesive plate 536 can receive voltage at the same time and/or from the same power supply (e.g., the power supply 418 described above in connection with FIG. 8).

To facilitate curling of the electroadhesive gripping surface 510, gripper 500 includes a backing adhered to the backside 539 of the gripping surface 510. The backing is configured to transition between a curled shape and an uncurled shape via force applied by the spreading arms 538a-b, which depends on the position of the sliding collar 528. The backing can include four sections 548, 550, 552, 554. Each of the sections 548, 550, 552, 554 can extend along the backside 538 from an interior portion of the gripping surface 510 (e.g., a central region) to an exterior portion of the gripping surface 510. For example, the sections 548, 550, 552, 554 can each extend to a respective corner of the gripping surface 510. For example, the section 548 extends from a position near the center of the gripping surface to a distal end 546 near a corner of the gripping surface 510. In some examples, the gripping surface may not have any corners (e.g., a circular or elliptical gripping surface) in which case the distal ends of the backing sections may extend to an outer edge of the gripping surface.

The backing section 548 includes a compressible side 544 with multiple notches therein oriented at least partially transverse to the direction in which the backing section 548 curls. The notches define multiple bend locations at which the backing section 548 bends toward the compressible side 544, thereby shortening the length of the compressible side 544 relative to the opposite side 542 that is coupled to the gripping surface 510. The notches in the backing sections 548, 550, 552, 554 can be oriented partially transverse to the lengths of the respective section. The multiple notches in each section of the backing may be oriented parallel with one another such that the bend locations that cause the curling/uncurling movement of the sections 548, 550, 552, 554 are oriented in parallel.

The two spreading arms 538a-b combine to simultaneously uncurl or curl the backing sections. The first spreading arm 538a is coupled to a linkage 540a, which is coupled to the first and second backing sections 548, 550. The linkage 540a can be received into mounts in the sections 548, 550 near the distal ends of the sections 548, 550 (e.g., the distal end 546 of the section 548). The linkage 540a may be configured to rotate within the respective section mounts, or at the point of connection with the spreading arm 538a to allow the coupling to be maintained as the sections 548, 550 undergo rotation while being curled and uncurled. The linkage 540a may also be substantially parallel to the notches in the sections 548, 550 such that the force imparted via the rod 540a is directed along the curling/uncurling path of the sections 548, 550. Similarly, the sections 552, 554 are coupled to the spreading arm 538b via a linkage 540b. Moving the spreading arm 538b along the shaft 520 (via the sliding collar 528) causes the linkage 540b to apply a force to the distal ends of the backing sections 552, 554 that is oriented substantially parallel to the orientation of the bend-marking notches in the sections 552, 554. Actuating the sliding collar 528 along the shaft 520 can thereby simultaneously urge the backing sections 548, 550, 552, 554 to be curled or uncurled, depending on the direction of travel of the sliding collar 528.

Furthermore, it is noted that the spreading arms 538a-b and linkages 540a-b described in connection with FIG. 9A are provided for example purposes only. In some cases, other configurations may be employed using a spreading arm to change the shape of a curl-biased backing (and an electroadhesive gripping surface adhered thereto). For example, a backing may be configured with notches (bend locations) oriented along concentric rings centered on the shaft 520 (or locally tangential portions of concentric rings). The spreading arms may then be adapted to apply force at the distal ends of the backing sections substantially transverse to the orientation of the notches so as to urge the backing to move along its curling/uncurling path. Such concentric arrangements, in which respective backing sections are configured to bend along locally concentric lines with the shaft, may create a relatively greater degree of two-dimensional curvature in the gripping surface while the backing is in its curled shape (e.g., a convex curved shape). By contrast, an arrangement with all notches oriented in parallel may lead to relatively greater degree of one-dimensional curvature.

Figure 9B:
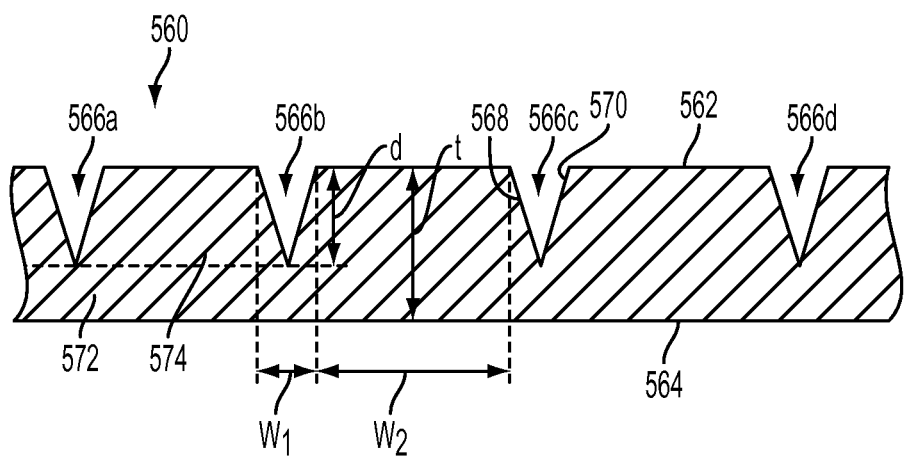
FIG. 9B illustrates in cross-section view a section of an example curling backing.

FIG. 9B illustrates in cross-section view a section of an example curling backing section 560. The backing 560 has a compressible side 562 and an opposite side 564 that can be adhered to an electroadhesive gripping surface, for example. The backing section 560 includes notches 566a-d in the compressible side 562. The notch 566c has angled side faces 568, 570 that meet at a line, which defines the bending axis of the notch 566c. In some cases, the notches 566a-d can extend all the way through the thickness t of the backing 560, such that any remaining connected portions of the backing 560 (e.g., along the backside of the electroadhesive gripping surface) can flex to allow the backing to bend at the notches 566a-d. During curling in the section 560, the compressible side 562 may become shorter than the opposite side 564 by the faces 568, 570 moving toward one another as the backing section 560 bends around the notch 566c. The total thickness t of the backing 560 can therefore be divided into a compressible region 574 that extends from the compressible side 562 to the depth d of the notches 56aa-d, and a bendable region 572 that extends through the remainder of the section 560. During curling, the regions of the bendable region 572 surrounding each of the notches 566a-d are deformed by shear stress. To allow the gaps in the notches 566a-d to become smaller, and thereby shorten the compressible side 562 relative to the opposite side 564, the relatively small thickness of the bendable region 572 bends around the notches 566a-d. The amount of curling deformation afforded by the backing 560 is based on the size of each notch $W_1$ and the spacing between adjacent notches $W_2$, each of which may or may not be uniformly distributed across the backing. For example, relatively greater sized notches, or relatively greater spatial densities of notches, or some combination thereof may be arranged near points of relatively greater curling flexion on the backing 560 (e.g., near the distal end 546 of the backing section 548 in FIG. 9A).

Figure 9C:
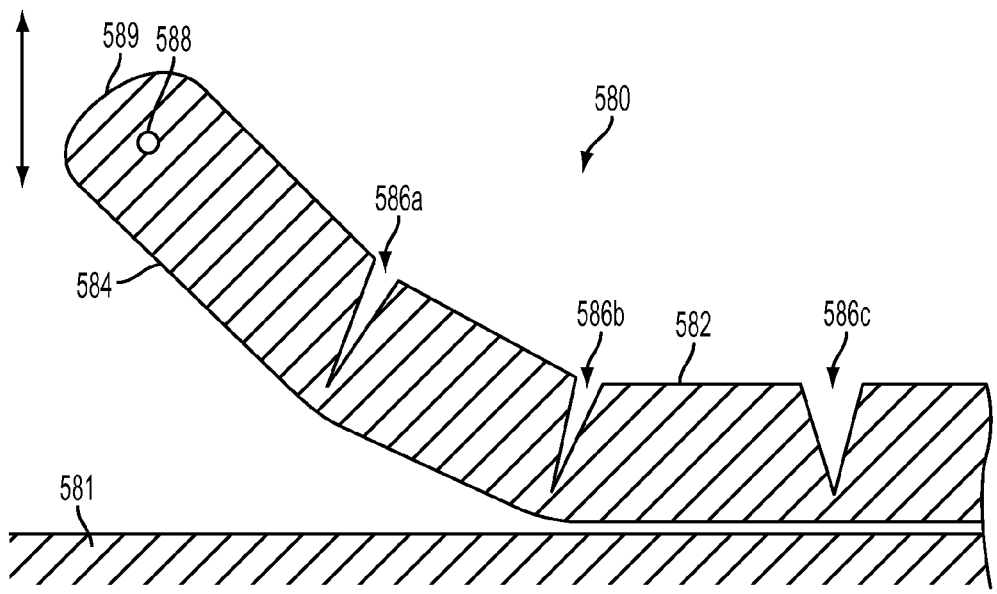
FIG. 9C illustrates in cross-section view an example curling backing in a curled shape.

FIG. 9C illustrates in cross-section view an example curling backing 580 in a curled shape. The backing 580 includes a compressible side 582 and an opposite side 584. The opposite side 584 is uncurling (or curling) onto (or away from) a surface of an object 581. The object 581 may be a substantially flat substrate with sufficient surface hardness to enable a vacuum seal between the object 581 and the opposite side 584. In object 581 may be, for example, a glass sheet or another material. An electroadhesive surface (not shown) may be coupled to the opposite side 584 and thereby be curled/uncurled along the shape defined by the backing 580. The compressible side 582 includes notches 586a-c that create bending locations for the backing 580 to curl/uncurl. To effect curling/uncurling, the backing 580 is manipulated via a force (direction indicated by the arrow in FIG. 9C) applied via linkage 588 near the distal end 589 of the backing 580. The linkage 588 and applied force may be similar to the force applied via the spreading arms 538a-b via the linkages 540a-b in the gripping device 500 of FIG. 9A. The notches 586a-b nearest the distal end 589 are compressed while the notch 586c is substantially uncompressed. The compression of the two notches 586a-b while the notch 586c is uncompressed illustrates the spatially sequential curling/uncurling operation of the backing 580.

During uncurling (i.e., application of the backing—and adhered gripping surface—to the object 581), the force on the linkage 588 is downward. The object-facing side 584 of the backing 580 progressively flattens out against the object 581 so as to sweep across the object 581 and remove air gaps between the interface of the object 581 and the gripping surface in the process. The contact begins with an initial portion (e.g., near a center portion of the backing not visible in FIG. 9C) and moves outward toward the distal end 589. In the view shown in FIG. 9C, the backing 580 is nearly completely flattened against the object and the only curled/compressed portions remaining are those nearest the distal end 589. In the instant immediately prior to the action shown in FIG. 9C, the notch 586c transitioned from a compressed state to an uncompressed state, and the portion of the backing 580 between the two notches 586c and 586b transitioned to become flat against the object 581. Moreover, the flattening of the section between the notches 586c and 586b was carried out in a pseudo-rolling, heel-to-toe fashion in which contact with the object 581 began near the notch 586c, and swept across the sub-section to the area near the notch 586b (from right to left in the view shown in FIG. 9C). In the instant immediately following the view shown in FIG. 9C, the notch 586b transitions to an uncompressed, uncurled state similar to the notch 586c, and the section of the backing 580 between notches 586b and 586a flattens onto the object 581 with a sweeping motion.

During curling, (i.e., peeling away of the backing—and adhered gripping surface—from the object 581), the force on the linkage 588 is upward. The object-facing side 584 of the backing is progressively peeled away from the object 584 by the curling motion of the backing 580. By beginning the peeling process at the distal end 589, nearest the edge of the gripping surface, the vacuum seal between the gripping surface and the object 581 can be quickly and predictably broken. In particular, the outside-to-inside peeling motion avoids pulling against the vacuum seal with a normal force. The peeling begins with the distal end 589 and moves inward across the backing 580 until the entire gripping surface is detached from the item 581. In the instant immediately prior to the action depicted in FIG. 9C, the notch 586b is in an uncompressed (uncurled) state and the section of the backing between the notched 586a and 586b is flattened against the surface of the object 581. The peeling motion detaches the section between the notches 586a and 586b in a spatially sequential manner by first separating the portion of the backing 580 nearest the notch 586a and gradually peeling the backing 580 away toward the portion near the notch 586b (the peel progresses from left to right in the view shown in FIG. 9C). Immediately following the view shown in FIG. 9C, the notch 586c transitions to a compressed (curled) state, and the portion of the backing between the notches 586b and 586c also peels away from the object 581.

In some cases, the vacuum sealing uncurling operation and the peeling unsealing curling operation are time-ordered opposites of one another.

Figure 9D:
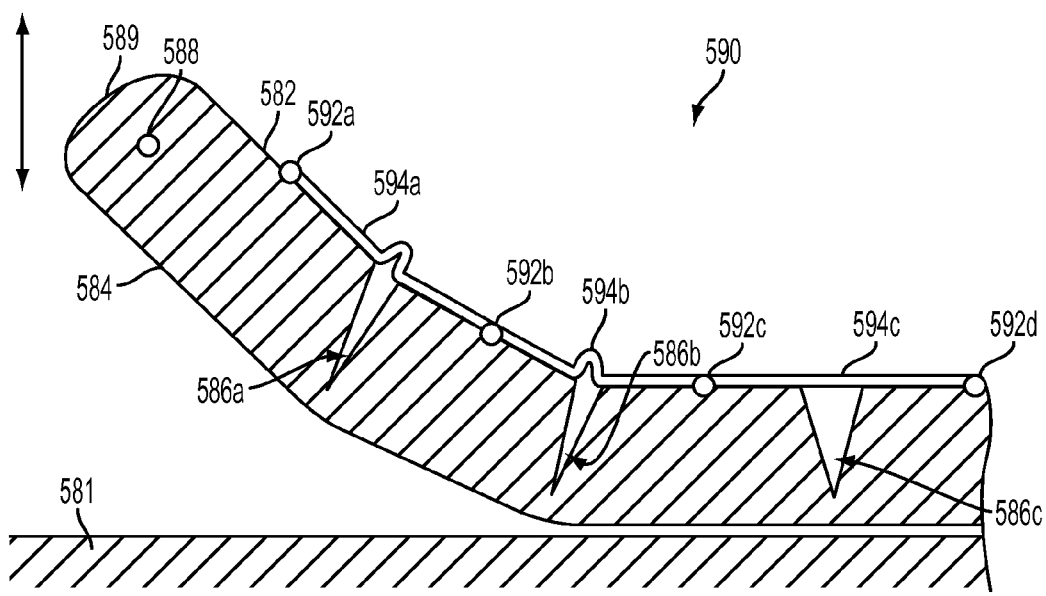
FIG. 9D illustrates in cross-section view an example curling backing equipped with flexible tethers to enforce one way curling.

FIG. 9D illustrates in cross-section view an example curling backing equipped with flexible tethers to enforce one way curling. In the backing 590, a flexible tether is added to connect adjacent portions of the backing 590 together at connection points 592a-d to ensure the length of the compressible side 582 does not exceed the length allowed by the tethers 594a-c. The connection points 592a can be anchored or otherwise coupled along the compressible side 582 of the backing 590. The flexible tethers 594a-c that connect the connection points 592a-d allow the compressible side 582 to undergo compression, yet prevent the compressible side 582 from expanding beyond the length allowed by the tethers 594a-c. The tethers 594a-c can each be set to a length to allow the backing 590 to reach a flattened, uncurled shape, but not to extend beyond (i.e., to prevent hyperextension beyond the uncurled shape). With reference to FIG. 9A, using such length limiting tethers along the compressible side can be used to prevent the backing sections 548, 550, 552, 554 from curling in a direction opposite the intended direction.

3b) Example Operation of Vacuum-Augmented Electroadhesive Device

Figure 10A:
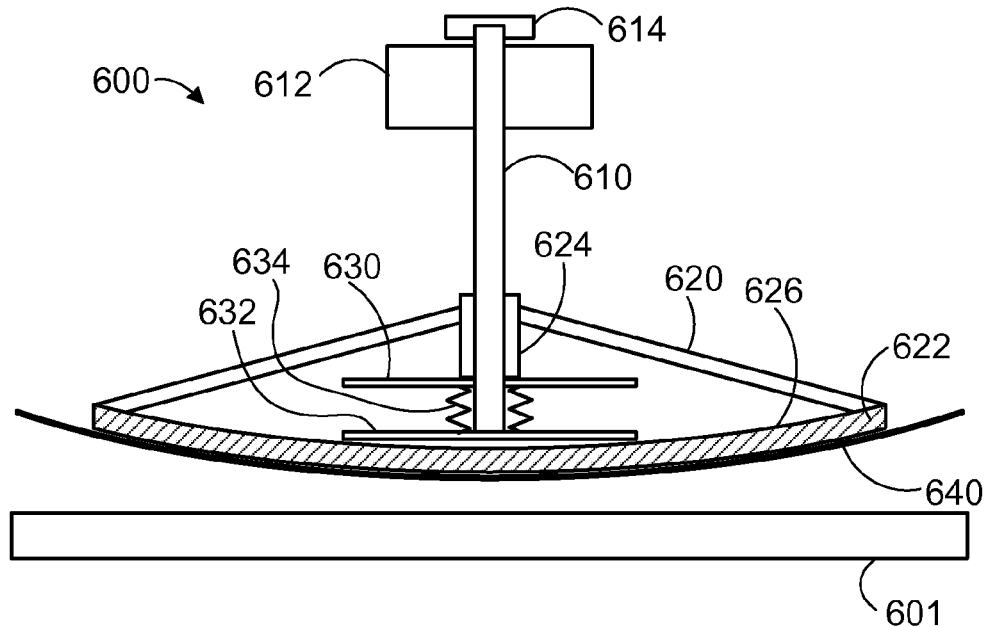
FIG. 10A is a side view of an example vacuum-augmented electroadhesive gripper approaching a substrate.

FIG. 10A is a side view of an example vacuum-augmented electroadhesive gripper 600 approaching a substrate 601. The gripper 600 can be similar to either of the vacuum-augmented gripping systems described above in connection with FIGS. 8-9. The gripper 600 includes an electroadhesive gripping surface 640 coupled to a curl-biased backing 626. The curl-biased backing is configured to flex between a curled shape and an uncurled shape in response to force applied by the spreading arms 620 at the distal end 622 of the backing 626. The spreading arms 620 are coupled at their other side to a sliding collar 624 which is configured to slide along a shaft 610. An electroadhesive shape fixing device includes an electroadhesive plate 632 coupled to the shaft 610 and a sliding plate 630 coupled to the sliding collar 624. A bias spring 634 biases the plates 630, 632 in a separated position. The spring 634 also biases the curl-biased backing 622 in a curled position via force from the spring 634 on the sliding collar 624, which conveys force to the distal end 622 of the backing 626 via the spreading arms 620. The shaft 610 also connects to a lifting sleeve 612, which is coupled to a load-bearing structure such as a control arm, gantry, etc., to manipulate the gripper 600. The lifting sleeve 612 mechanically engages a stop 614 on one end of the shaft 610 to lift the grippe 600 vertically and/or engages the sliding collar 624 to cause the backing 626 to change shape.

Figure 10B:
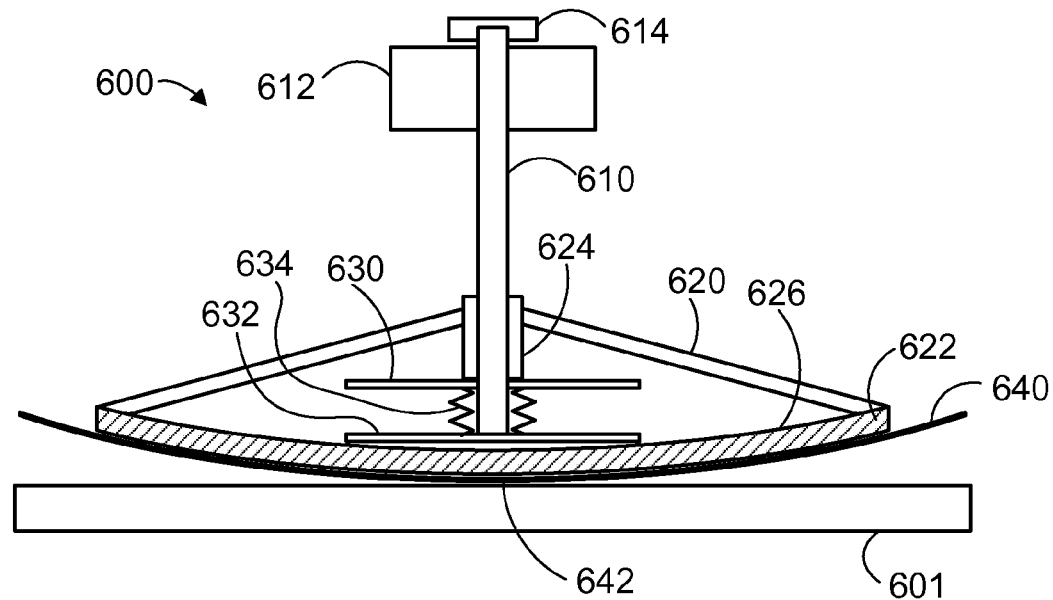
FIG. 10B shows the gripper of FIG. 10A as it first contacts the substrate.

FIG. 10B shows the gripper 600 of FIG. 10A as it first contacts the substrate 601. The lifting sleeve 612 lowers the gripper 600 until an initial portion 642 of the gripping surface 640 makes contact with the substrate 601. For a convex-curvature backing 626 (and thus gripping surface 640) the point of initial contact 642 can be an apex of the convex curved gripping surface 640.

Figure 10C:
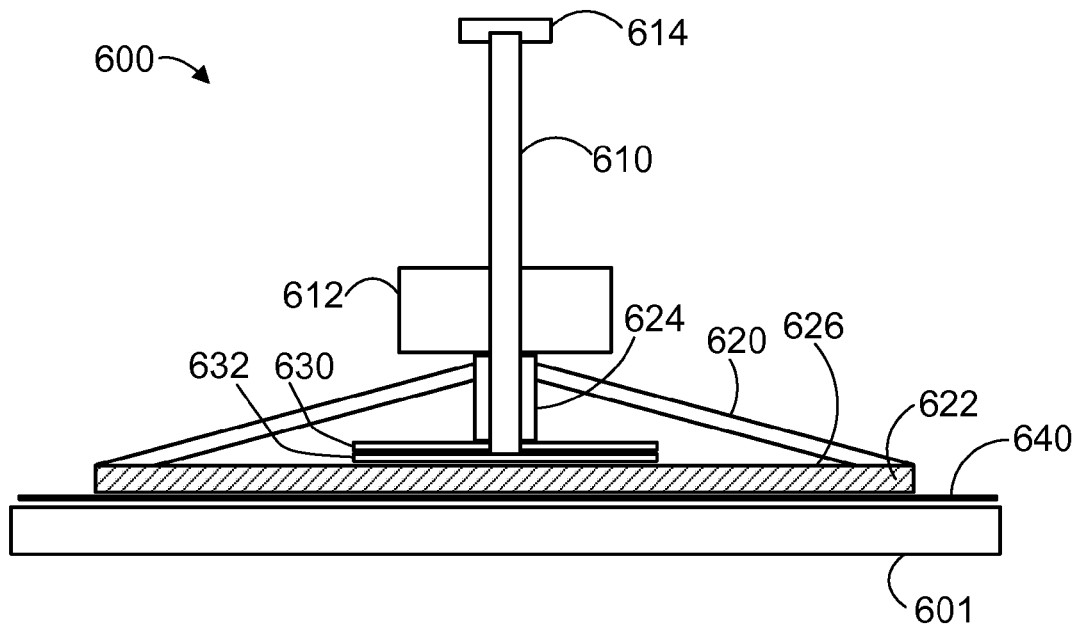
FIG. 10C shows the gripper of FIG. 10A being spread across the substrate to create a vacuum adhesion.

FIG. 10C shows the gripper 600 of FIG. 10A being spread across the substrate 601 to create vacuum adhesion. Following the point of initial contact 642 (FIG. 10B), the lifting sleeve 612 continues to descend along the shaft 610 until the lifting sleeve 612 contacts the top surface of the sliding collar 624. The lifting sleeve 612 can then force the sliding collar 624 downward along the shaft 610. Moving the sliding collar 624 downward simultaneously pushes the sliding plate toward 630 toward the electroadhesive plate 632 and pushes the spreading arms 620 outward to apply force at the distal end 622 of the backing 626. The force on the backing 626 may be conveyed via a rotating linkage aligned with orientations of predetermined bends in the backing 626 (e.g., such as the bend locations defined by the notches in the backing sections of FIG. 9A). The force applied by spreading arms 620 causes the backing 626 (and the electroadhesive gripping surface 640) to be progressively flattened against the substrate 601. The contact between the gripping surface 640 and the substrate 601 begins at the point of initial contact 642 and sweeps outward. As the backing 626 uncurls against the substrate 601, the portion of the gripping surface 640 that contacts the substrate 601 immediately following the initial point of contact 642 is a portion immediately adjacent the initial point of contact 642. The outward sweep continues such that a given portion of the gripping surface 640 only makes contact with the substrate 601 after all intervening points between the given portion and the initial point of contact 642 are also in contact with the substrate 642. Once the uncurling/flattening is complete, the gripping surface 640 is substantially vacuum sealed against the substrate 601 because the uncurling, sweeping connection functions to substantially sweep away air and contaminants from the interface between the gripping surface 640 and the substrate 601.

During the uncurling application of the gripping surface 640 to the substrate 601, the electroadhesive gripping surface 640 and the electroadhesive plate 632 are both turned on. The gripping surface 640 induces a polarization in the substrate 601, which creates an electrostatic attraction between the gripping surface and the substrate 601. The induced electrostatic attraction complements and strengthens the vacuum-based attraction. The electroadhesive plate 632 also adheres to the sliding plate 630, which holds the sliding collar 624 in position on the shaft 610 and thereby holds the spreading arms 620 in place so as to maintain the uncurled shape of the backing 626. In some embodiments, the sliding plate 630 may additionally or alternatively have a polarizing voltage applied to it.

Figure 10D:
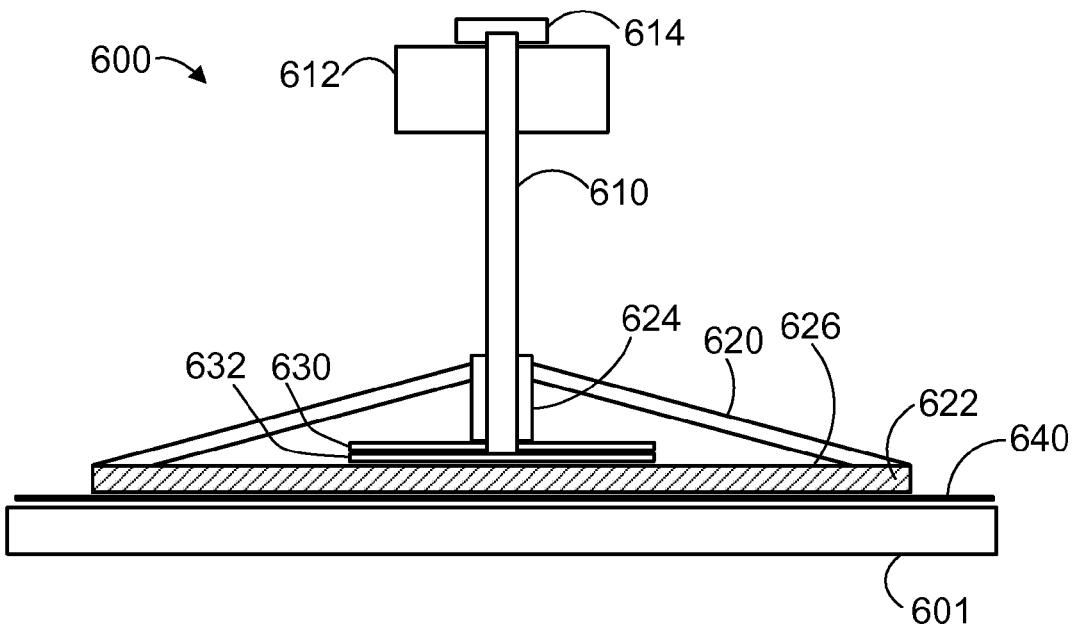
FIG. 10D shows the gripper of FIG. 10A lifting the substrate while adhesion is provided by both vacuum and electroadhesive forces.

FIG. 10D shows the gripper 600 of FIG. 10A lifting the substrate 601 while adhesion is provided by both vacuum and electroadhesive forces. The lifting sleeve 612 moves back up the shaft 610 to engage the stop 614. The lifting sleeve 612 can then be manipulated by position control systems to manipulate the substrate 601 to a desired location and/or orientation (e.g., the position control system 418 of FIG. 8A).

Figure 10E:
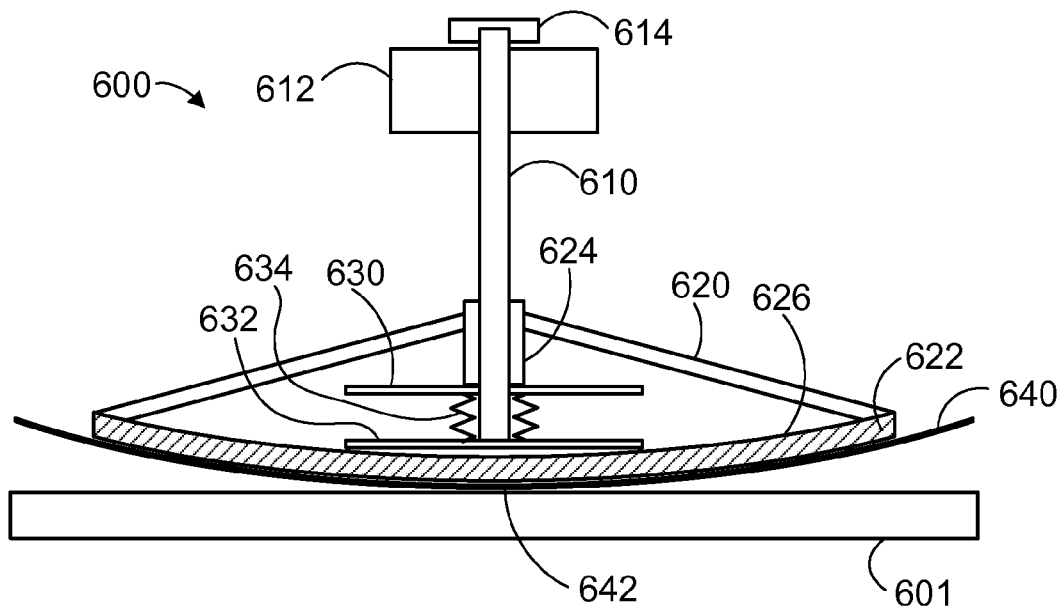
FIG. 10E shows the gripper of FIG. 10A deactivating the vacuum and the electroadhesion to release the substrate.

FIG. 10E shows the gripper 600 of FIG. 10A deactivating the vacuum and the electroadhesion to release the substrate 601. After the substrate 601 is placed in a desired position, the electroadhesion of both the gripping surface 640 and the shape holding plates 630, 632 is deactivated (e.g., the polarizing voltage is reduced or turned off). The deactivation causes the electroadhesive gripping surface 640 to release the substrate 601, because the electroadhesive attraction between the gripping surface 640 and the substrate 601 ceases. In addition, the release of the holding plates 630, 632 allow the compression spring 634 to force the plates 630, 632 apart, which pushes the spreading arms 620 to the curl position. The movement of the spreading arms 620 induces the backing to peel away from the substrate 601, beginning with the distal edge 622 and moving toward the central point 642. The peeling motion breaks the vacuum seal and thus the substrate 601 is released from the vacuum-augmented gripper 600.

IV. Electroadhesive Device with Separately Addressable Regions

In addition to, or as an alternative to, the use of curl-biased frames to make and break vacuum seals that are then augmented by electroadhesion, the present disclosure provides for electroadhesive gripping devices configured to generate such sweeping connections across a gripping surface. Separately addressable regions of a given electroadhesive gripping surface can be used to sequentially activate electroadhesion across the gripping surface, such that the electroadhesion begins at an initial location and then sweeps outward. Separately addressable regions include electrodes that can be separately driven by an external power supply and/or control system. For example, such gripping surfaces may have distinct electrode terminals for each separately addressable region in the gripping surface, and each region is activated by applying voltage to the corresponding terminal for the particular region.

Figure 11A:
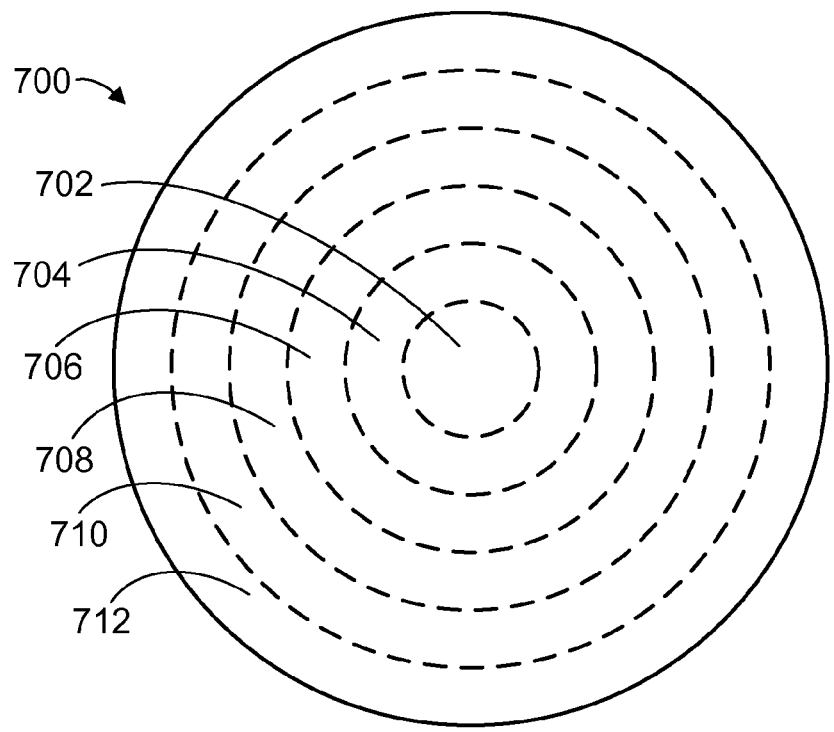
FIG. 11A illustrates an example electroadhesive gripper with separately activated regions patterned to facilitate vacuum-augmented electroadhesion.

FIG. 11A illustrates an example electroadhesive gripper 700 with separately addressable electrodes in different regions 702-712 patterned to facilitate vacuum-augmented electroadhesion. The separately addressable regions 702-712 include a centrally located region 702, and successively larger non-overlapping concentric ring sections 704-712 surrounding the central region. To adhere the gripper 700 to an object, such as a flat substrate, the gripper 700 is positioned with its central region 702 in contact with (or proximate to) the target foreign object. Electroadhesion is then activated in the central region 702, which causes the central region 702 of the gripping surface to adhere to the target object. Electroadhesion is then activated in each concentric ring in sequence beginning with the ring region 704 immediately adjacent the central region 702, then the next adjacent ring region 706, then the next adjacent ring region 708, then the next adjacent ring region 710, and finally the outer-most ring region 712. The sequential sweep of electroadhesion activation from the central region 702 to the outer ring 712 functions to sweep air and contaminants outward and away from the interface between the gripping surface and the target object. The spatially sequential adherence of the gripper 700 can thus create a vacuum seal between the gripping surface and the target object. Similarly, to release the target object, electroadhesion is deactivated in the reverse order to allow the gripping surface to peel away from the target object from the outer ring region 712 to the central region 702.

In some examples, the time ordered sequence of activating the electroadhesion in the separately addressable ringed regions 702-712 is similar to the sequential contact between the curl-biased frames and the target substrates as the curl-biased frames are uncurled (e.g., flattened) onto the target substrate so as to create a vacuum seal.

Figure 11B:
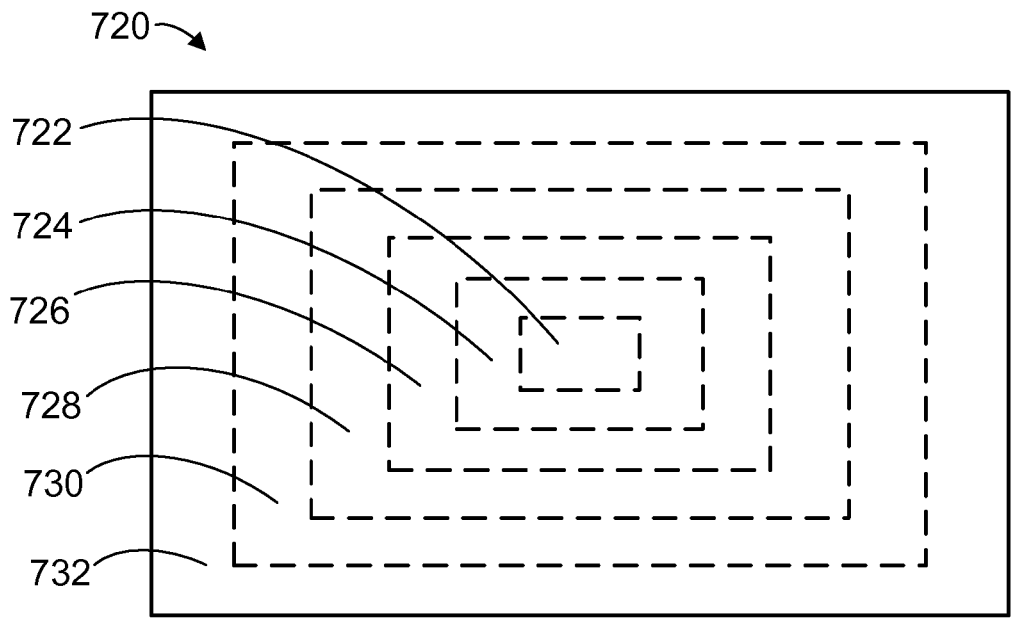
FIG. 11B illustrates another example electroadhesive gripper with separately activated regions patterned to facilitate vacuum-augmented electroadhesion.

FIG. 11B illustrates another example electroadhesive gripper 720 with separately addressable electrode regions 722-732. The separately addressable regions 722-732 include a centrally located region 722, and successively larger non-overlapping regions 724-732 surrounding the central region 722. To adhere the gripper 720 to an object, such as a flat substrate, the gripper 720 is positioned with its central region 722 in contact with (or proximate to) the target foreign object. Electroadhesion is then activated in the central region 722, which causes the central region 722 of the gripping surface to adhere to the target object. Electroadhesion is then activated in each concentric ring in sequence beginning with the region 724 immediately adjacent the central region 722, then the next adjacent region 706, then the next adjacent region 728, then the next adjacent region 730, and finally the outer-most region 732. The sequential sweep of electroadhesion activation from the central region 722 to the outer region 732 functions to sweep air and contaminants outward and away from the interface between the gripping surface and the target object. The spatially sequential adherence of the gripper 720 can thus create a vacuum seal between the gripping surface and the target object. Similarly, to release the target object, electroadhesion is deactivated in the reverse order to allow the gripping surface to peel away from the target object from the outer region 732 to the central region 722.

Figure 11C:
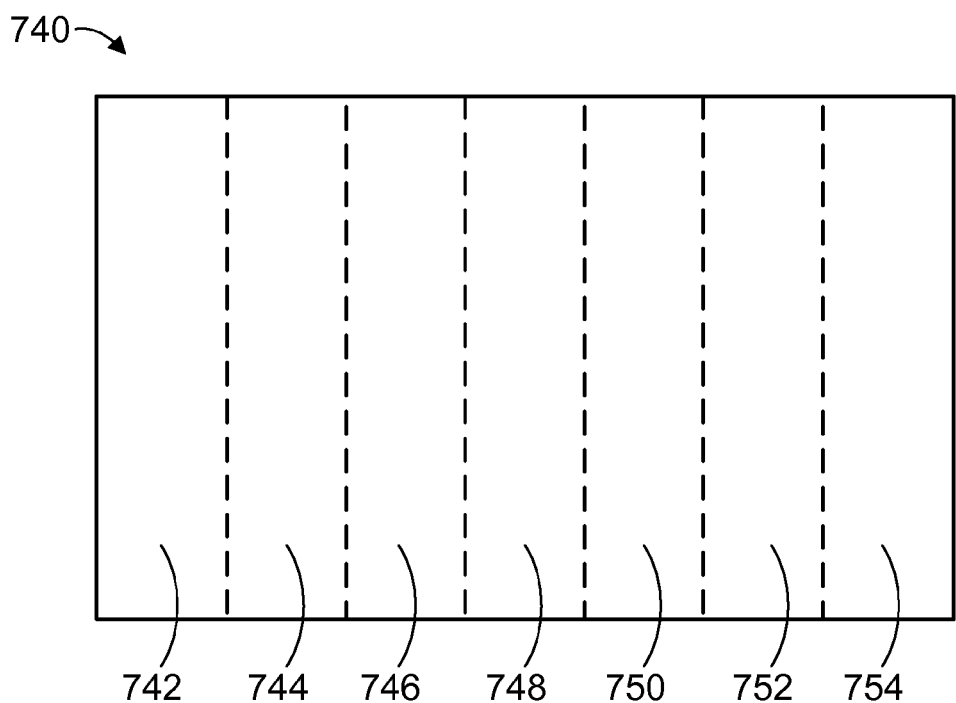
FIG. 11C illustrates another example electroadhesive gripper with separately activated regions patterned to facilitate vacuum-augmented electroadhesion.

FIG. 11C illustrates another example electroadhesive gripper 740 with separately addressable electrode regions 742-754. The separately addressable regions 742-754 may be substantially similar rectangular sections that adjacent to one another. The separately addressable regions can be sequentially turned on such that an initial region is first adhered to the target object and followed by adjacent ones of the regions. In one example, the gripper 740 can be positioned such that the first edge region 742 is in contact with the target object (or proximate to the target object). Electroadhesion in the region 742 can be activated, followed by the regions 744-754 in order, such that the gripper 740 sweeps across the target object. In another example, the gripper 740 may initially adhere to the target object using the region 748, and then the two immediately adjacent regions 746, 750 can be activated next, followed by the next adjacent regions 744, 752 and the next adjacent regions 742, 754. Other examples are also possible.

V. Alternative Configurations

Examples described herein relate to use systems for creating a vacuum seal between an electroadhesive gripping surface and an object using a curl-biased frame that is initially convex and is uncurled by pressing the frame against the object. The resulting uncurling motion of the frame causes the gripping surface to be smoothed across the object surface in a progressive manner so as to substantially evacuate air and other contaminants from the sealed region. However, other techniques may be employed to create a vacuum seal at the interface between an electroadhesive gripping surface and an object surface. For instance, the gripping surface may be actuated by an array of height-adjustable pins that are operated to initially contact a target object with a portion of the gripping surface and then progressively expand the region contacting the target object by pushing adjacent sections of the gripping surface toward the target object.

In some cases, vacuum adhesion can be created with a target item, such as a sheet of glass or another substrate without employing electrostatic adhesion at all. For example, a deformable pad (e.g., a silicone-based material, etc.) can be adhered to a curl-biased backing. The deformable pad can then be pressed against the target substrate and spreading arms can be used to uncurl the backing such that the deformable pad is sealed against the substrate (e.g., due to the uncurling motion evacuating air and other contaminants so as to create a vacuum seal).

Some examples of the present disclosure may find application in permanently or semi-permanently adhering items to a variety of substrates. For example, a television, or picture frame, or other item may be adhered to a wall using electroadhesion supplemented with vacuum adhesion using one or more systems/devices disclosed herein.

Vacuum augmented systems and devices may be employed by people/robots climbing walls, hanging from ceilings, etc. or other applications where removable, non-damaging, load-bearing attachments are desirable. Applications in which the load force is substantially normal to the surface of interaction with the gripping surface may be particularly well suited for the disclosed vacuum-augmented systems and devices, because vacuum-based adhesion forces are strongest normal to the adhered surface.

The vacuum-augmented systems and devices disclosed herein may find applications in situations in which vacuum seals alone or electroadhesion are not suitable choices for item handling. However, in some examples, electroadhesion and vacuum adhesion complement one another to make of for potential shortcomings of either technology by itself. For example, an electrostatic attraction may be unable, by itself, to provide sufficient force to handle a material with relatively weak conductivity, such as glass. However, when augmented by vacuum adhesion, the electrostatic attraction reinforces the vacuum attraction and makes it m more resilient against transient forces. Similarly, dusty substrates covered by particular matter may make vacuum-based adhesion technology unsuitable by itself, because the contaminants make formation of an adequate vacuum seal challenging. However, when augmented by electrostatic adhesion, the gripping surface contains small particulates against the gripping surface and thereby prevents bubbles and air pockets from developing in the vacuum sealed interface.

VI. Example Operations

Figure 12A:
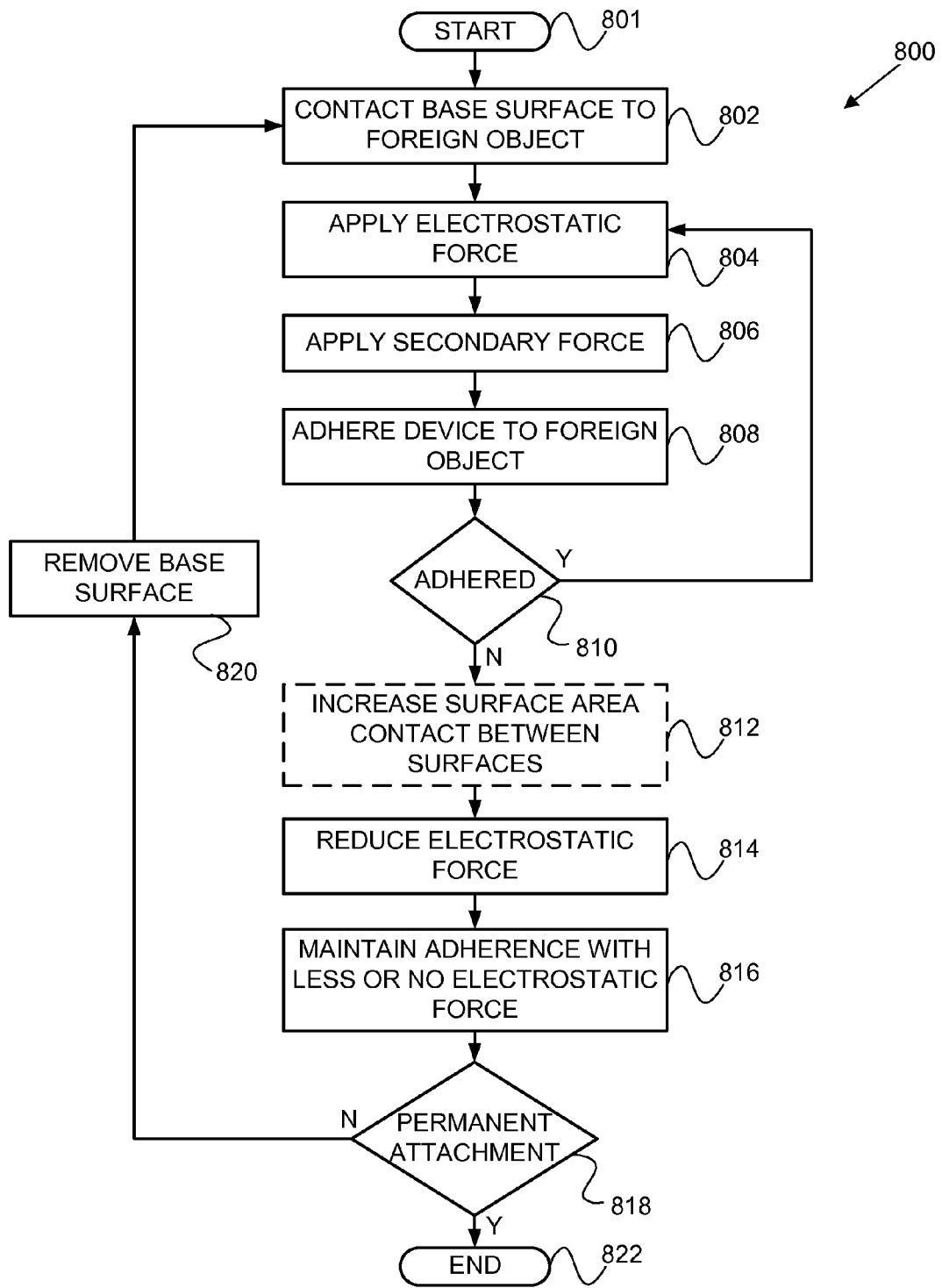
FIG. 12A is a flowchart of a process for operating an example electroadhesive device augmented by a secondary adhesion force.

FIG. 12A is a flowchart of a process 800 for physically controlling a foreign object. Although a wide variety of applications involving providing manipulating objects using electroadhesion can be imagined, one basic method is provided here as an example. In particular, such a method can involve operating an electroadhesive or electrostatic device or system such as that which is described in greater detail above. It will be readily appreciated that not every method step set forth in this flowchart is always necessary, and that further steps not set forth herein may also be included. For example, neither increasing surface area contact between surfaces nor reducing electrostatic force is necessary in all embodiments. Further, the exact order of steps may be altered as desired for various applications. For example, steps 804 and 806 may be reversed or performed in parallel. Also, some steps may not be under control of the user, but may occur automatically in conjunction with and/or as a result of another step being performed. For example, step 806 might not be under control of the user, but happens as a result of step 804 being performed. This can occur, for example, where the surface has a sealing vacuum or van der Waals force in conjunction with an electroadhesive force. Other variations are also possible, as will be readily appreciated.

Beginning with a start step 801, a base surface is contacted to a surface of a foreign object at process step 802. An electrostatic force is then applied, such as by applying an electrostatic adhesion voltage, at process step 804, and a separate physical force or other secondary force is applied at process step 806. Again, the separate physical attraction or force can be provided by way of contacting the base surface at step 802, or as some combination of steps 802 and 804, or can be an entirely separate mechanism or process. The relevant electrostatic or electroadhesive device is thereby at least somewhat adhered to a foreign object or substrate at process step 808. At a subsequent decision step 810 an inquiry is made as to whether an adequate level of adherence is taking place. If not, then the method reverts to process step 804, where electrostatic force is applied or even increased.

Once an adequate level of adherence is observed at step 810, then the method continues to process step 812, where the surface area contact can optionally be increased between surfaces of the device and the foreign object. At the next process step 814, the electrostatic force can be reduced or even eliminated altogether, such as by reducing or shutting off the power to the electrodes. Adherence of the device to the foreign object or substrate is then maintained with less or no electrostatic force at process step 816. An inquiry can then be made at the following decision step 818 as to whether a permanent attachment between the device and foreign object is desired. If not, then the method can continue to process step 820, where the base surface is removed from contact from the foreign object or substrate. Although not shown, the method can also end at this point. Alternatively, the method can then be fully repeated starting at process step 802.

In the event that a permanent attachment is desired (or alternatively where object handling is finished) at process step 818, however, then the method proceeds to finish at and end step 822. Further steps not depicted can include, for example, moving or repositioning the base surface with respect to the foreign object, such as between times where adherence forces are applied. Other steps can include causing phase changes in materials for the secondary force, or reducing the separate physical or secondary force at pertinent times or locations, for example, and any or all of the steps may be repeated any number of times, as may be desired.

Figure 12B:
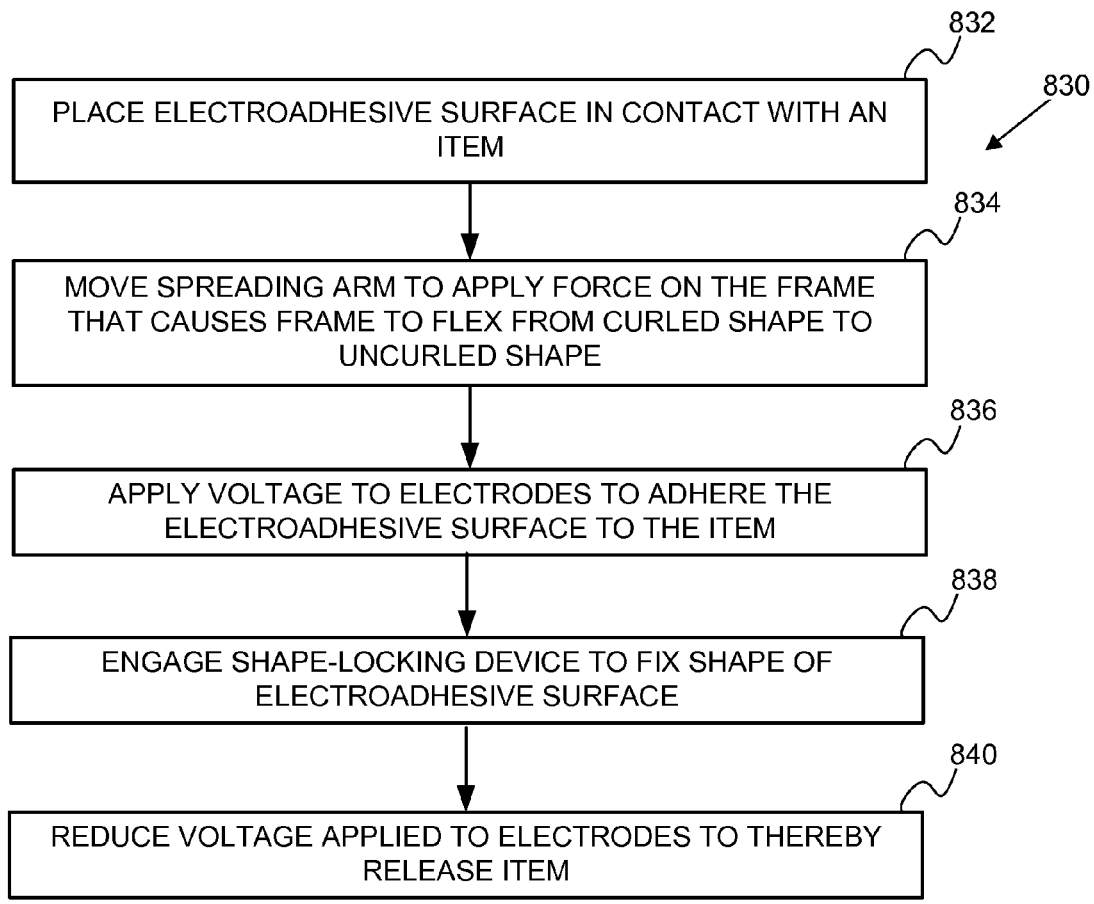
FIG. 12B is a flowchart of another process for operating an example vacuum-augmented electroadhesive device.

FIG. 12B is a flowchart of a process 830 for operating an example vacuum-augmented electroadhesive device. The process 830 can be performed, for example, by the vacuum augmented systems and/or devices described in connection FIGS. 8-11. An item is placed in contact with an electroadhesive surface of a gripping device (832). The electroadhesive surface can be coupled to a frame with a backing that can change from a curled shape to an uncurled shape in response to force on the backing applied by a spreading arm. The backing of the frame may be biased in the curled shape, and may be coupled to the electroadhesive gripping surface such that the shape of the gripping surface is defined by the backing. The spreading arm can be moved to apply force on the curl-biased frame that causes the frame to flex from the curled shape to the uncurled shape (834). The uncurling motion of the backing can cause the gripping surface to expand outward from a region of initial contact (as in block 832) to sequentially sweep across the surface of the target item. The spatially sequential expansion of the gripping surface across the item as the gripping surface uncurls/flattens under force of the spreading arm creates a vacuum seal between the gripping surface and the target item.

A polarizing voltage can then be applied to the electrodes in the electroadhesive gripping surface to cause the gripping surface to adhere to the target item (836). A shape-locking device can be engaged to fix the shape of the electroadhesive gripping surface (838). The shape-locking device may include a pair of plates that adhere to one another via electroadhesion to hold the spreading arm in position, which fixes the shape of the electroadhesive gripping surface. The shape-locking device may additionally or alternatively include alternative positioning devices such as solenoids, stepper motors, hydraulic systems, ratcheting systems, etc., configured to fix the position of the spreading arms. With the shape of the electroadhesive surface fixed, due to the process of blocks 838, and the item adhered to the electroadhesive surface, due to the process of block 836, the item can optionally be manipulated via the frame while remaining securely held by the vacuum-augmented gripper. Once the item is repositioned, re-oriented, or otherwise manipulated as desired (or not), the voltage applied to the gripper electrodes is reduced to allow the item to detach from the electroadhesive surface (840). In some examples, the item may be moved or otherwise manipulated prior to being released from the electroadhesive surface in block 840. In some examples, the item may be secured in a substantially stationary, fixed position prior to being released from the electroadhesive surface in block 840. Thus, the electroadhesion can be used to move and/or secure an adhered item. The reduction in electroadhesion voltage may also release the shape-locking device, such that the curl-biased frame returns to its curled shape and thereby peels the gripping surface away from the target item so as to release the vacuum seal holding the two together. However, the frame may also return to a curled shape without relying on a restorative bias, such as by operation of a solenoid to urge the spreading arms back to a position in which the frame is curled, etc.

Figure 13:
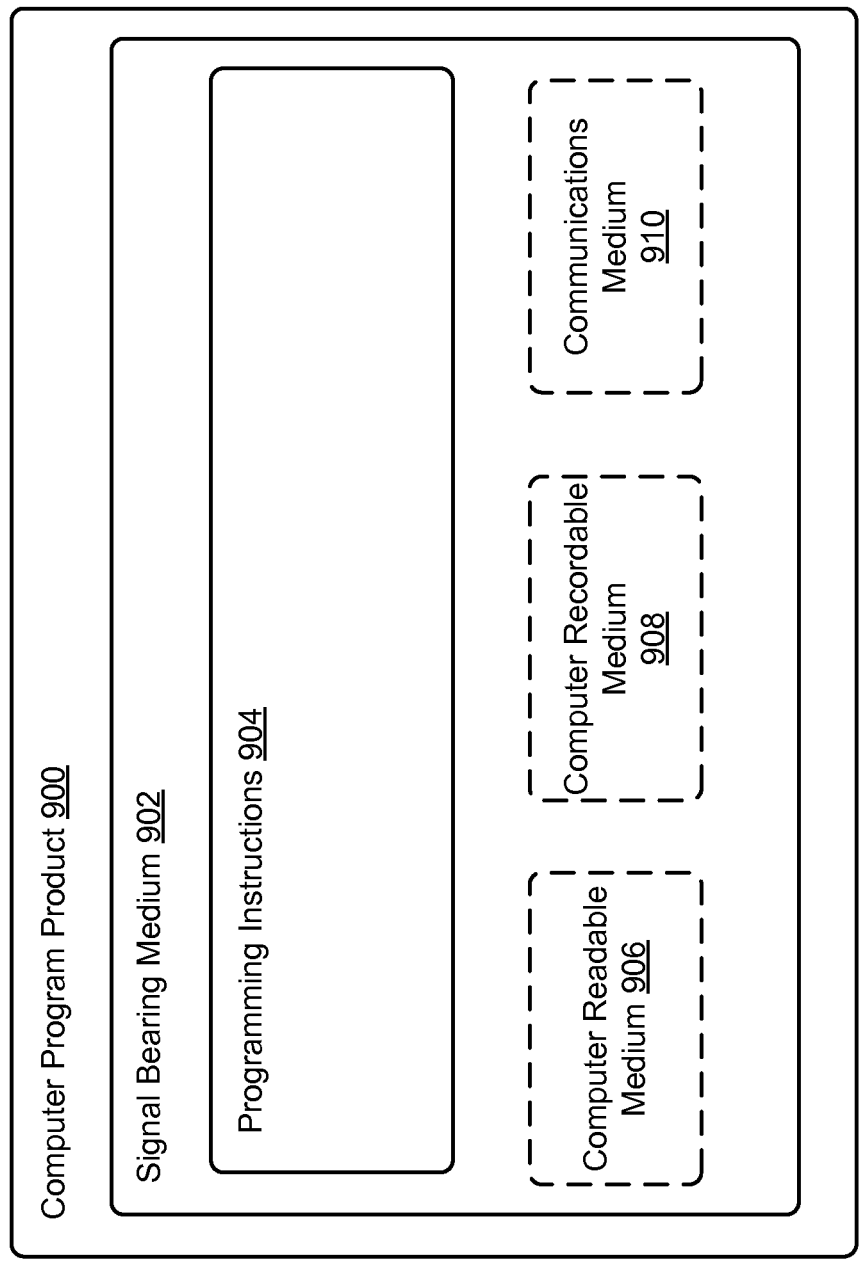
FIG. 13 depicts a computer-readable medium configured according to an example embodiment.

FIG. 13 depicts a computer-readable medium configured according to an example embodiment. In example embodiments, the example system can include one or more processors, one or more forms of memory, one or more input devices/interfaces, one or more output devices/interfaces, and machine-readable instructions that when executed by the one or more processors cause the system to carry out the various functions, tasks, capabilities, etc., described above.

As noted above, in some embodiments, the disclosed techniques can be implemented by computer program instructions encoded on a non-transitory computer-readable storage media in a machine-readable format, or on other non-transitory media or articles of manufacture. FIG. 13 is a schematic illustrating a conceptual partial view of an example computer program product 900 that includes a computer program for executing a computer process on a computing device, arranged according to at least some embodiments presented herein, including the processes shown and described in connection with FIG. 10.

In one embodiment, the example computer program product 900 is provided using a signal bearing medium 902. The signal bearing medium 902 may include one or more programming instructions 904 that, when executed by one or more processors may provide functionality or portions of the functionality described above with respect to FIGS. 1-12. In some examples, the signal bearing medium 902 can include a non-transitory computer-readable medium 906, such as, but not limited to, a hard disk drive, a Compact Disc (CD), a Digital Video Disk (DVD), a digital tape, memory, etc. In some implementations, the signal bearing medium 902 can be a computer recordable medium 908, such as, but not limited to, memory, read/write (R/W) CDs, R/W DVDs, etc. In some implementations, the signal bearing medium 902 can be a communications medium 910, such as, but not limited to, a digital and/or an analog communication medium (e.g., a fiber optic cable, a waveguide, a wired communications link, a wireless communication link, etc.). Thus, for example, the signal bearing medium 902 can be conveyed by a wireless form of the communications medium 910.

The one or more programming instructions 904 can be, for example, computer executable and/or logic implemented instructions. In some examples, a computing device is configured to provide various operations, functions, or actions in response to the programming instructions 904 conveyed to the computing device by one or more of the computer readable medium 906, the computer recordable medium 908, and/or the communications medium 910.

The non-transitory computer readable medium 906 can also be distributed among multiple data storage elements, which could be remotely located from each other. The computing device that executes some or all of the stored instructions can be a microfabrication controller, or another computing platform. Alternatively, the computing device that executes some or all of the stored instructions could be remotely located computer system, such as a server.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A system comprising:
an electroadhesive surface associated with one or more electrodes;
a load-bearing backing coupled to a backside of the electroadhesive surface so as to at least partially define a shape thereof, wherein the backing is configured to flex from a curled shape to an uncurled shape, wherein the flexion induces a corresponding transition in the shape of the electroadhesive surface; and
a power supply configured to apply a voltage to the one or more electrodes associated with the electroadhesive surface to thereby cause the electroadhesive surface to adhere to an item situated proximate to the electroadhesive surface.

2. The system according to claim 1, wherein the transition in shape of the electroadhesive surface includes transitioning from a first shape, in which the backing has the curled shape, to a second shape, in which the backing has the uncurled shape, wherein the first shape has a greater convex curvature than the second shape.

3. The system according to claim 2, wherein the backing is configured such that the transition from the first shape to the second shape, by the electroadhesive surface, is carried out by (i) an initial portion of the electroadhesive surface becoming substantially coincident with a corresponding portion of the second shape, and (ii) in response to a force applied to the backing, a subsequent portion of the electroadhesive surface immediately adjacent to the initial portion becoming substantially coincident with another portion of the second shape.

4. The system according to claim 3, wherein the transition is carried out in a spatially sequential manner such that a given portion of the electroadhesive surface becomes coincident with a corresponding portion of the second shape only after all points on the electroadhesive surface between the given portion and the initial portion are also substantially coincident with respective portions of the second shape.

5. The system according to claim 1, wherein the change in shape of the electroadhesive surface includes changing from a convex curved surface, in which the backing has the curled shape, to a substantially flat surface, in which the backing has the uncurled shape.

6. The system according to claim 1, wherein the backing includes a plurality of notches in a notched side of the backing opposite a side coupled to the backside of the electroadhesive surface, wherein the notches are configured such that the backing flexes to the curled shape via compression of gaps in the notches so as to decrease a length of the notched side relative to the side coupled to the backside of the electroadhesive surface.

7. The system according to claim 6, wherein the notches are substantially parallel and oriented transverse to a length of the backing.

8. The system according to claim 6, wherein the backing further includes a tether coupled to the notched side between the plurality of notches such that, while the backing is in the uncurled shape, tension in the tether resists an increase in length of the notched side.

9. The system according to claim 1, further comprising:
a spreading arm coupled to the backing and configured to apply force to the backing so as to cause the backing to flex from the curled shape to the uncurled shape; and
a shape-locking device configured to selectively lock the position of the spreading arm while the flexible support member is in the uncurled position, thereby fixing the shape of the electroadhesive surface.

10. The system according to claim 9, wherein the shape-locking device includes a biasing device configured to bias the backing in the curled shape, via the spreading arm, while the shape-locking device is not engaged, and wherein the shape-locking device is configured to overcome the bias on the spreading arm, while the shape-locking device is engaged.

11. The system according to claim 9, wherein the shape-locking device includes an electroadhesive plate having one or more electrodes that, in response to application of a voltage to the one or more electrodes, cause the spreading arm to hold the backing in the uncurled shape.

12. The system according to claim 11, further comprising:
a controller configured to: (i) cause the power supply to apply voltage to the one or more electrodes associated with the electroadhesive surface so as to cause the electroadhesive surface to adhere to the item, and (ii) cause the power supply to apply voltage to the electroadhesive plate to selectively engage the shape-locking device so as to fix the shape of the electroadhesive surface.

13. The system according to claim 1, further comprising:
a shaft coupled to the spreading arm via a sliding cuff configured to slide along a length of the shaft from a first position to a second position, wherein the shaft in the first position causes the spreading arm to hold the backing in the curled shape, and wherein the shaft in the second position causes the spreading arm to hold the backing in the uncurled shape.

14. The system according to claim 13, further comprising:
a force conveying cuff configured to slide along the shaft adjacent the sliding cuff so as to engage the sliding cuff to move from the first position to the second position.

15. The system according to claim 1, wherein the electroadhesive surface is configured to create a substantially airtight seal with the item.

16. A method comprising:
placing an electroadhesive surface in contact with an item, wherein the electroadhesive surface is coupled to a load-bearing backing, wherein the backing is coupled to a backside of the electroadhesive surface so as to at least partially define a shape thereof;

applying force to the backing so as to cause the backing to flex from a curled shape to an uncurled shape, wherein the flexion induces a corresponding transition in the shape of the electroadhesive surface;

applying voltage to one or more electrodes associated with the electroadhesive surface to thereby cause the electroadhesive surface to adhere to the item; and reducing the voltage applied to the one or more electrodes such that the item is released from the electroadhesive surface.

17. The method according to claim 16, wherein the transition in shape of the electroadhesive surface includes transitioning from a first shape, in which the backing has the curled shape, to a second shape, in which the backing has the uncurled shape, wherein the first shape is a surface with a greater convex curvature than the second shape.

18. The method according to claim 17, wherein the backing is coupled to a spreading arm configured to convey the applied force to the backing so as to cause the backing to flex from the curled shape to the uncurled shape, and wherein the electroadhesive surface transitioning from the first shape to the second shape comprises:

an initial portion of the electroadhesive surface becoming substantially coincident with a corresponding portion of the second shape, and in response to the force applied via the spreading arm, a given portion of the electroadhesive surface becoming substantially coincident with a corresponding portion of the second shape only after all points on the electroadhesive surface between the given portion and the initial portion are also substantially coincident with respective portions of the second shape.

19. The method according to claim 16, wherein the change in shape of the electroadhesive surface includes changing from a convex curved surface, in which the backing has the curled shape, to a substantially flat surface, in which the backing has the uncurled shape.

20. The method according to claim 16, wherein the backing is coupled to a spreading arm configured to convey the applied force to the backing so as to cause the backing to flex from the curled shape to the uncurled shape, the method further comprising:

engaging a shape-locking device configured to selectively lock the position of the spreading arm while the backing is in the uncurled position, thereby fixing the shape of the electroadhesive surface.

* * * * *